(12) United States Patent　　(10) Patent No.:　　US 7,605,649 B2
Sutardja　　(45) Date of Patent:　　Oct. 20, 2009

(54) NESTED TRANSIMPEDANCE AMPLIFIER

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 11/643,557

(22) Filed: Dec. 21, 2006

(65) Prior Publication Data

US 2007/0115051 A1　　May 24, 2007

Related U.S. Application Data

(63) Continuation of application No. 11/495,813, filed on Jul. 28, 2006, now Pat. No. 7,551,024, which is a continuation-in-part of application No. 10/459,731, filed on Jun. 11, 2003, now Pat. No. 7,276,965, which is a continuation-in-part of application No. 10/072,843, filed on Feb. 6, 2002, now Pat. No. 6,762,644.

(60) Provisional application No. 60/817,268, filed on Jun. 29, 2006, provisional application No. 60/798,480, filed on May 8, 2006, provisional application No. 60/798,567, filed on May 8, 2006, provisional application No. 60/759,899, filed on Jan. 18, 2006, provisional application No. 60/275,109, filed on Mar. 13, 2001.

(51) Int. Cl.
　　*H03F 1/24*　　(2006.01)
(52) U.S. Cl. ............................ 330/98; 330/99; 330/100; 330/107; 250/214 A
(58) Field of Classification Search ................... 330/98, 330/99, 214 A, 107, 100; 250/214 A
See application file for complete search history.

(56) References Cited

U.S. PATENT DOCUMENTS

| 3,365,673 | A | 1/1968 | Barditch et al. |
| 3,737,798 | A | 6/1973 | Faraguet et al. |
| 3,760,287 | A | 9/1973 | Harris |
| 3,918,005 | A | 11/1975 | Bruckenstein et al. |
| 4,535,233 | A | 8/1985 | Abraham |
| 4,564,818 | A | 1/1986 | Jones |
| 4,724,315 | A | 2/1988 | Goerne |
| 4,731,590 | A | 3/1988 | Saari |

(Continued)

FOREIGN PATENT DOCUMENTS

EP　　1 096 671　　5/2001

(Continued)

OTHER PUBLICATIONS

Brian Black; "Analog-to-Digital Converter Architectures for Choices for System Design"; Analog Dialogue 33-8 (1999); 4 pages.

(Continued)

*Primary Examiner*—Patricia Nguyen

(57) ABSTRACT

A transimpedance amplifier comprises a first operational amplifier having an input and an output. A second operational amplifier has an input and an output that communicates with the input of the first operational amplifier. A first feedback element has one end that communicates with the input of the first operational amplifier and another end that communicates with the output of the first operational amplifier, wherein the first feedback element comprises a first capacitance. A second feedback element communicates with the input of the first operational amplifier and another end that communicates with the output of the first operational amplifier.

30 Claims, 38 Drawing Sheets

U.S. PATENT DOCUMENTS

| | | | |
|---|---|---|---|
| 4,749,955 | A | 6/1988 | Cook |
| 4,764,732 | A | 8/1988 | Dion |
| 4,772,859 | A | 9/1988 | Sakai |
| 4,914,402 | A | 4/1990 | Dermitzakis et al. |
| 4,919,534 | A | 4/1990 | Reed |
| 5,010,588 | A | 4/1991 | Gimlett |
| 5,042,299 | A | 8/1991 | Wells |
| 5,049,834 | A | 9/1991 | Kasai |
| 5,142,286 | A | 8/1992 | Ribner et al. |
| 5,155,455 | A | 10/1992 | Cowley et al. |
| 5,345,073 | A | 9/1994 | Chang et al. |
| 5,382,920 | A | 1/1995 | Jung |
| 5,532,471 | A | 7/1996 | Khorramabadi et al. |
| 5,646,573 | A | 7/1997 | Bayruns et al. |
| 5,734,293 | A | 3/1998 | Gross |
| 5,761,225 | A * | 6/1998 | Fidric et al. ............ 372/6 |
| 5,793,230 | A | 8/1998 | Chu et al. |
| 5,822,104 | A | 10/1998 | Saito |
| 6,037,841 | A | 3/2000 | Tanji et al. |
| 6,040,793 | A * | 3/2000 | Ferguson et al. ............ 341/143 |
| 6,057,738 | A | 5/2000 | Ku et al. |
| 6,084,478 | A | 7/2000 | Mayampurath |
| 6,114,913 | A | 9/2000 | Entrikin |
| 6,122,131 | A | 9/2000 | Jeppson |
| 6,188,494 | B1 * | 2/2001 | Minteer ............ 398/135 |
| 6,292,052 | B1 | 9/2001 | Carlson |
| 6,330,279 | B1 | 12/2001 | Belser et al. |
| 6,353,324 | B1 | 3/2002 | Uber et al. |
| 6,466,091 | B1 | 10/2002 | Kejariwal et al. |
| 6,515,540 | B1 | 2/2003 | Prasad et al. |
| 6,525,589 | B1 | 2/2003 | Thomsen et al. |
| 6,552,605 | B1 | 4/2003 | Yoon |
| 6,593,810 | B2 | 7/2003 | Yoon |
| 6,642,496 | B1 | 11/2003 | Gulbransen |
| 6,664,912 | B1 | 12/2003 | Zanchi |
| 6,713,749 | B2 | 3/2004 | Wu et al. |
| 6,724,258 | B1 | 4/2004 | Fayed |
| 6,762,644 | B1 | 7/2004 | Sutardja |
| 6,836,182 | B1 | 12/2004 | Sutardja |
| 6,958,656 | B2 | 10/2005 | Yamashita et al. |
| 7,002,409 | B1 | 2/2006 | Aram |
| 7,049,892 | B2 | 5/2006 | Matsunaga et al. |
| 7,075,364 | B2 * | 7/2006 | Gudem et al. ............ 327/552 |
| 2002/0017953 | A1 | 2/2002 | Singor |
| 2002/0153949 | A1 | 10/2002 | Yoon |
| 2005/0237401 | A1 * | 10/2005 | Tan et al. ............ 348/255 |

FOREIGN PATENT DOCUMENTS

| | | |
|---|---|---|
| JP | 406061752 A | 3/1994 |
| JP | H6-61752 | 3/1994 |
| WO | WO 99/46607 | 9/1999 |

OTHER PUBLICATIONS

Dallas Maxim; "Demystifying Sigma-Delta ADCs"; A/D and D/A Conversion/Sampling Circuits; Temperature Sensors; Application Note 1870; Jan. 31, 2003; 15 pages.

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages.

Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; 2000 IEEE International Solid-State Circuits Conference; 9 pages.

Axel Thomsen, Edwin de Angel, Sherry Ziachong Wu, Aryesh Amar, Lei Wang, Wai Lee, WA 20.1 A DC Measurement IC with $130nV_{pp}$ Noise in 10Hz; ISSCC 2000/Session 20/Oversampled Converters/ Paper WA 20.1 ISSCC 2000 Slide Supplement; 5 pages.

M. Moyal, M. Groepl, H. Werker, G. Mitteregger, J. Schambacher; Xignal Technologies AG, Munich, Germany; 23.6 A 700/900mW/ Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages.

Charles A. Holt, "Electronic Circuits Digital and Analog", by John Wiley & Sons, Inc., 1978, pp. 423, 431, and 436.

You et al., SA 21.2 "A Multistate Amplifier Topology with Nested Gm-C Compensation for Low-Voltage Application", IEEE International Solid-State Circuits Conference, Digest of Technical Papers, ISSCC97, Feb. 8, 1997, pp. 348-349.

W. Grise, Dept. of IET, Morehead State University, Morehead, KY; Application of the Operational Transconductance Amplifier (OTA) to Voltage-controlled Amplifiers and Active Filters; 1998; 10 pages.

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; International Solid-State Circuits Conference, 2003; Digest of Technical Papers, Paper 23.6.; ISSCC 2003, Session 23, IEEE; 24 pages.

Sahu, B. et al; System-Level Requirements of DC-DC Converters for Dynamic Power Supplies of Power Amplifiers; ASIC, 2002. Proceedings 2002 IEEE Asia-Pacific Conference on Aug. 6-8, 2002, Piscataway, NJ, USA, IEEE, Aug. 6, 2002, pp. 149-152, XP010602815.

Official Communication from European Patent Office with extended European search report dated Jan. 30, 2009 regarding Application No. 07000520.2 —1233 / 1811657.

* cited by examiner

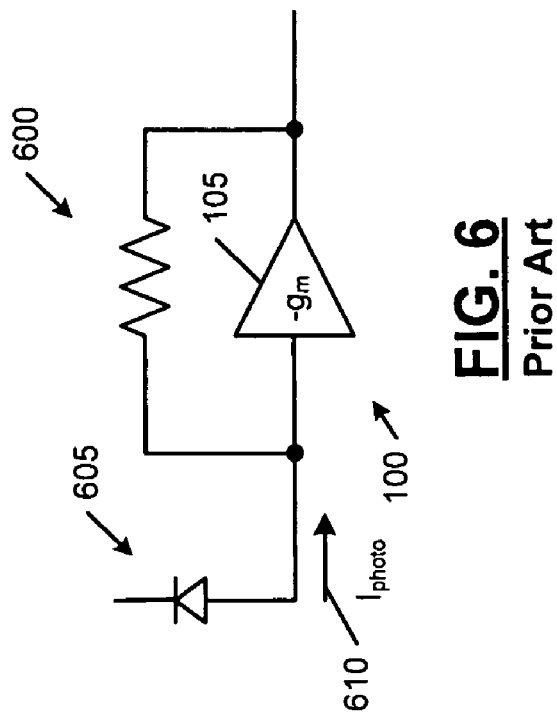
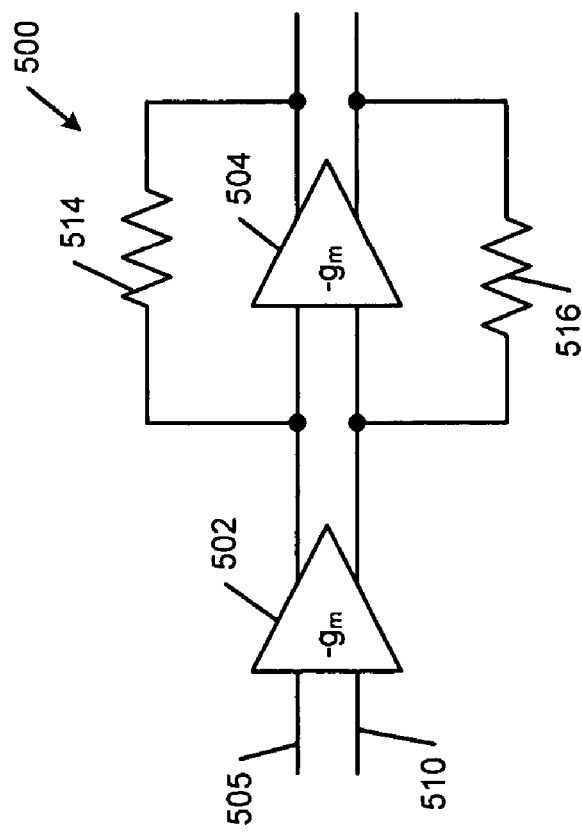

NESTED TRANSIMPEDANCE AMPLIFIER

CROSS-REFERENCE TO RELATED APPLICATIONS

This application is a continuation of U.S. patent application Ser. No. 11/495,813, filed Jul. 28, 2006, which application claims the benefit of U.S. Provisional Application No. 60/817,268, filed on Jun. 29, 2006, 60/798,480, filed May 8, 2006, 60/798,567, filed on May 8, 2006, and 60/759,899, filed on Jan. 18, 2006, and is a continuation-in-part of U.S. patent application Ser. No. 10/459,731 filed on Jun. 11, 2003, which is a continuation-in-part of application Ser. No. 10/072,843 filed Feb. 6, 2002. now U.S. Pat. No. 6,762,644 issued on Jul. 13, 2004, which claims the benefit of U.S. Provisional Application No. 60/275,109, filed Mar. 13, 2001. The aforementioned applications are hereby incorporated by reference in their entirety.

FIELD OF THE INVENTION

The present invention relates to transimpedance amplifiers, and more particularly to nested transimpedance amplifiers with an increased gain-bandwidth product.

BACKGROUND OF THE INVENTION

A transimpedance amplifier (TIA) is a well-known type of electronic circuit. Referring now to FIG. 1, a TIA 100 includes an operational amplifier (opamp) 105 having a gain parameter ($-g_m$). The opamp 105 is connected in parallel to a resistor ($R_f$) 110. The input to the TIA 100 is a current ($\Delta i$) 115. The output of the TIA 100 is a voltage ($\Delta v_o$) 120.

Referring now to FIG. 2, the opamp 105 of the TIA 100 is replaced by a current source 205 and a transistor 210 having gain $-g_m$. The TIA 100 in FIGS. 1 and 2 is often referred to as a transconductance amplifier because it converts the input current $\Delta i$ into the output voltage $\Delta v_o$.

Referring now to FIG. 3, a TIA 300 converts an input voltage ($\Delta v_i$) 305 into an output voltage ($\Delta v_o$) 310. The TIA 300 also includes a resistor 315 that is connected to a transistor 320. The TIA 300 is typically used in applications that require relatively low bandwidth.

Referring now to FIG. 4, a TIA 400 converts an input voltage ($\Delta v_i$) 405 into an output voltage ($\Delta v_o$) 410. The TIA 400 includes a second opamp 415, which is connected in series to a parallel combination of a resistor ($R_f$) 420 and an opamp 425. The TIA 400 is typically used for applications having higher bandwidth requirements than the TIA 300.

Ordinarily, the bandwidth of the TIA is limited to a fraction of a threshold frequency $f_T$ of transistor(s) that are used in the opamp(s). In the case of a bipolar junction transistor (BJT) such as a gallium-arsenide (GaAs) transistor, the bandwidth of the TIA is approximately equal to 10%-20% of $f_T$. For metal-oxide-semiconductor (MOS) transistor(s), the bandwidth of the TIA is typically a few percent (i.e., approximately 2%-6%) of $f_T$.

Referring now to FIG. 5, a TIA 500 may be configured to operate differentially using two inputs of each opamp 502 and 504. One input 505 acts as a reference, in a similar manner as ground or virtual ground in a standard configuration TIA. The input voltage $\Delta v_i$ and the output voltage $\Delta v_o$ are measured as voltage differences between a reference input 505 and a second input 510. Feedback resistors 514 and 516 are connected across the inputs and the outputs of the opamp 504.

Referring now to FIG. 6, one TIA application having a relatively high bandwidth requirement is that of an optical sensor. An optical sensor circuit 600 includes the opamp 105 and the resistor 110 of the TIA 100 that are coupled with a photodiode 605. The output of the photodiode 605 is a current $I_{photo}$ 610, which acts as an input to the TIA 100.

Increasingly, applications require both high bandwidth and high gain. Examples include optical sensors, such as fiber optic receivers, and preamplifier writers for high-speed hard disk drives.

SUMMARY OF THE INVENTION

A nested transimpedance amplifier (TIA) circuit includes a zero-order TIA having an input and an output, and a first operational amplifier (opamp). The opamp includes an input that communicates with said output of said zero-order TIA, a first transistor driven by said input, a second transistor that is driven by a first bias voltage and communicates with said first transistor, a first current source that communicates with said second transistor, and an output at a node between the first transistor and the second transistor.

In other features a second current source communicates with the first transistor. A gain of the opamp is greater than a gain of the zero-order TIA. A bandwidth of the opamp is less than a bandwidth of the zero-order TIA.

In other features the zero-order TIA includes a first opamp including a first input and a first output, a second opamp including a second input and a second output. The second input communicates with the first output. A resistance includes one end that communicates with the second output and a second end that communicates with the second input.

A nested differential mode transimpedance amplifier (TIA) circuit includes a zero-order differential mode TIA including first and second inputs and first and second outputs and a first differential mode operational amplifier (opamp). The opamp includes inputs that communicate with respective ones of said outputs of said zero-order differential mode TIA, a first transistor driven by a first said input, a second transistor driven by a second said input, a third transistor that is driven by a first bias voltage and communicates with said first transistor, a fourth transistor that is driven by the first bias voltage and communicates with said second transistor, a first current source that communicates with said third transistor, a second current source that communicates with said fourth transistor, and first and second outputs at respective connections between the first transistor and the third transistor, and between the second transistor and the fourth transistor.

In other features the nested differential mode TIA circuit includes a third current source that communicates with the first transistor and the second transistor. A gain of the first differential mode opamp is greater than a gain of the zero-order differential mode TIA. A bandwidth of the first differential mode opamp is less than a bandwidth of the zero-order differential mode TIA.

In other features the zero-order differential mode TIA includes a second differential mode opamp including inputs and outputs and a third differential mode opamp including inputs and outputs. The inputs of the third differential mode opamp communicate with respective outputs of the second differential mode opamp. Resistances include first ends and second ends. The first and second ends communicate with respective inputs and outputs of the third differential mode opamp.

A nested differential mode transimpedance amplifier (TIA) circuit includes a zero-order differential mode TIA having first and second inputs and first and second outputs, and a differential-mode push-pull opamp having first and second inputs and first and second outputs. The first and second inputs communicate with respective ones of said first and second outputs of said zero-order differential mode TIA.

In other features a gain of the differential-mode push-pull opamp is greater than a gain of the zero-order differential mode TIA and a bandwidth of the differential-mode push-pull opamp is less than a bandwidth of the zero-order differential mode TIA.

In other features the zero-order differential mode TIA includes a second differential mode opamp including inputs and outputs and a third differential mode opamp including inputs and outputs. The inputs of the third differential mode opamp communicate with respective outputs of the second differential mode opamp. Resistances include first ends and second ends. The first and second ends communicate with respective inputs and outputs of the third differential mode opamp.

A nested transimpedance amplifier (TIA) circuit includes a zero-order TIA having an input and an output, a first operational amplifier (opamp) having an output and an input that communicates with said output of said zero-order TIA, a first power supply input for applying a first voltage to the zero-order TIA, and a second power supply input for receiving a second voltage. A charge pump module develops a third voltage based on the first voltage and the second voltage. The third voltage is applied to the opamp.

In other features the zero-order TIA includes a first opamp including a first input and a first output and a second opamp including a second input and a second output. The second input communicates with the first output. A resistance includes one end that communicates with the second output and a second end that communicates with the second input.

In other features a voltage regulator regulates the second voltage. A light-emitting diode communicates with the opamp output. The first voltage is greater than the second voltage. The third voltage is approximately equal to a sum of the first voltage and the second voltage. The first voltage is otherwise applied to analog circuitry and the second voltage is otherwise applied to digital circuitry. The first voltage is between about 2.5V and 3.3V. The second voltage is about 1.2V.

A differential transimpedance amplifier circuit comprises a first operational amplifier having a first inverting input, a first non-inverting input, a first inverting output and a first non-inverting output; a second operational amplifier having a second inverting input, a second non-inverting input, a second inverting output and a second non-inverting output, wherein the second inverting output communicates with the first non-inverting input and the second non-inverting output communicates with the first inverting input; a first feedback element that communicates with the first non-inverting input and the first inverting output; a second feedback element that communicates with the first inverting input and the first non-inverting output; a third feedback element that communicates with the second inverting input and the first inverting output; and a fourth feedback element that communicates with the first non-inverting input and the first non-inverting output.

In other features, the third and fourth feedback elements comprise first and second resistances, respectively. The third and fourth feedback elements comprise first and second capacitances, respectively. The first and second feedback elements comprise first and second resistances, respectively. The first and second feedback elements comprise first and second capacitances, respectively. The first and second feedback elements each comprise a first resistance in series with an inductance and a second resistance that are in parallel with a capacitance. The capacitance includes a variable capacitance. The first and second feedback elements each comprise a resistance in parallel with a capacitance. The capacitance includes a variable capacitance.

In other features, the first and second feedback elements each comprise a first resistance in series with an inductance and that are in parallel with a capacitance and a second resistance. The capacitance includes a variable capacitance. The first and second operational amplifiers are transconductance amplifiers.

In other features, an integrator comprises the differential transimpedance amplifier.

A single-nested transimpedance amplifier circuit comprises a third operational amplifier having a third inverting input, a third non-inverting input, a third inverting output and a third non-inverting output; and the differential transimpedance amplifier circuit. The second inverting input communicates with the third non-inverting output and the second non-inverting input communicates with the third inverting output.

A double-nested differential transimpedance amplifier circuit comprises a single-nested transimpedance amplifier circuit; and a fourth operational amplifier having a fourth inverting input, a fourth non-inverting input, a fourth inverting output and a fourth non-inverting output. The fourth inverting output communicates with the third non-inverting output and the fourth non-inverting output communicates with the third inverting input.

In other features, a fifth feedback element communicates with the fourth inverting output and the first inverting output. A sixth feedback element communicates with the fourth non-inverting output and the first non-inverting output. The fifth and sixth feedback elements comprise first and second resistances, respectively. The fifth and sixth feedback elements comprise first and second capacitances.

A Sigma-Delta analog to digital converter comprises the differential transimpedance amplifier. The Sigma-Delta analog to digital converter comprises a difference amplifier module that includes one input that receives an input signal; an integrator module that communicates with an output of the difference amplifier module; a comparator module that receives an output of the integrator module; and a digital to analog converter that communicates with an output of the comparator module and another input of the difference amplifier module.

In other features, a filter and decimation module receives an output of the comparator module. At least one of the difference amplifier module, the integrator module and the comparator module includes the differential transimpedance amplifier.

A differential transimpedance amplifier circuit comprises first amplifying means for amplifying having a first inverting input, a first non-inverting input, a first inverting output and a first non-inverting output; second amplifying means for amplifying having a second inverting input, a second non-inverting input, a second inverting output and a second non-inverting output, wherein the second inverting output communicates with the first non-inverting input and the second non-inverting output communicates with the first inverting input; first feedback means for providing feedback that communicates with the first non-inverting input and the first inverting output; second feedback means for providing feedback that communicates with the first inverting input and the first non-inverting output; third feedback means for providing feedback that communicates with the second inverting input and the first inverting output; and fourth feedback means for providing feedback that communicates with the first non-inverting input and the first non-inverting output.

In other features, the third and fourth feedback means comprise first and second resistance means for providing resistance, respectively. The third and fourth feedback means comprise first and second capacitances for providing capacitance, respectively. The first and second feedback means comprise first and second resistance means for providing resistance, respectively. The first and second feedback means comprise first and second capacitance means for providing capacitance, respectively. The first and second feedback means each comprise first resistance means for providing resistance in series with inductance means for providing inductance and second resistance means for providing resistance that are in parallel with a capacitance means for providing capacitance. The capacitance means provides a variable capacitance. The first and second feedback means each comprise resistance means for providing resistance in parallel with capacitance means for providing capacitance. The capacitance means provides a variable capacitance. The first and second feedback means each comprise first resistance means for providing resistance in series with inductance means for providing inductance and that are in parallel with capacitance means for providing capacitance and second resistance means for providing resistance. The capacitance means provides a variable capacitance. The first and second amplifying means include transconductance amplifiers.

A single-nested transimpedance amplifier circuit comprises third amplifying means for amplifying having a third inverting input, a third non-inverting input, a third inverting output and a third non-inverting output; and the differential transimpedance amplifier circuit. The second inverting input communicates with the third non-inverting output and the second non-inverting input communicates with the third inverting output.

A double-nested differential transimpedance amplifier circuit comprises a single-nested transimpedance amplifier circuit; and fourth amplifying means for amplifying having a fourth inverting input, a fourth non-inverting input, a fourth inverting output and a fourth non-inverting output. The fourth inverting output communicates with the third non-inverting output and the fourth non-inverting output communicates with the third inverting input.

In other features, fifth feedback means for providing feedback communicates with the fourth inverting output and the first inverting output. Sixth feedback means for providing feedback communicates with the fourth non-inverting output and the first non-inverting output. The fifth and sixth feedback means comprise first and second resistance means for providing resistance, respectively.

A Sigma-Delta analog to digital converter comprises the differential transimpedance amplifier. The Sigma-Delta analog to digital converter includes difference amplifier means for amplifying that includes one input that receives an input signal; integrator means for integrating that communicates with an output of the difference amplifier means; comparator means for comparing that receives an output of the integrator means; and digital to analog converter means for converting that communicates with an output of the comparator means and another input of the difference amplifier means.

In other features, filter and decimation means for filtering and decimating receives an output of the comparator means. At least one of the difference amplifier means, the integrator means and the comparator means includes the differential transimpedance amplifier.

A differential transimpedance amplifier circuit comprises a first operational amplifier having a first inverting input, a first non-inverting input, a first inverting output and a first non-inverting output; a second operational amplifier having a second inverting input, a second non-inverting input, a second inverting output and a second non-inverting output, wherein the second inverting output communicates with the first non-inverting input and the second non-inverting output communicates with the first inverting input; a third operational amplifier having a third inverting input, a third non-inverting input, a third inverting output and a third non-inverting output, wherein the second inverting input communicates with the third non-inverting output and the second non-inverting input communicates with the third inverting output; a fourth operational amplifier having a fourth inverting input, a fourth non-inverting input, a fourth inverting output and a fourth non-inverting output, wherein the fourth inverting output communicates with the third non-inverting output and the fourth non-inverting output communicates with the third inverting input; a first feedback element that communicates with the second non-inverting input and the second inverting output; a second feedback element that communicates with the second inverting input and the second non-inverting output; a third feedback element that communicates with the third non-inverting input and the first inverting output; a fourth feedback element that communicates with the third inverting input and the first non-inverting output; a fifth feedback element that communicates with the fourth inverting input and the first inverting output; and a sixth feedback element that communicates with the fourth non-inverting output and the first non-inverting output.

In other features, the first and second feedback elements comprise first and second resistances, respectively. The third and fourth feedback elements comprise first and second resistances, respectively. The fifth and sixth feedback elements comprise first and second resistances, respectively.

A Sigma-Delta analog to digital converter comprises the differential transimpedance amplifier. The Sigma-Delta analog to digital converter comprises a difference amplifier module that includes one input that receives an input signal; an integrator module that communicates with an output of the difference amplifier module; a comparator module that receives an output of the integrator module; and a digital to analog converter that communicates with an output of the comparator module and another input of the difference amplifier module.

In other features, a filter and decimation module receives an output of the comparator module. At least one of the difference amplifier module, the integrator module and the comparator module includes the differential transimpedance amplifier.

A differential transimpedance amplifier circuit comprises first amplifying means for amplifying having a first inverting input, a first non-inverting input, a first inverting output and a first non-inverting output; second amplifying means for amplifying having a second inverting input, a second non-inverting input, a second inverting output and a second non-inverting output, wherein the second inverting output communicates with the first non-inverting input and the second non-inverting output communicates with the first inverting input; a third amplifying means for amplifying having a third inverting input, a third non-inverting input, a third inverting output and a third non-inverting output, wherein the second inverting input communicates with the third non-inverting output and the second non-inverting input communicates with the third inverting output; a fourth amplifying means for amplifying having a fourth inverting input, a fourth non-inverting input, a fourth inverting output and a fourth non-inverting output, wherein the fourth inverting output communicates with the third non-inverting output and the fourth non-inverting output communicates with the third inverting input; a first feedback means for providing feedback that communicates with the second non-inverting input and the second inverting output; a second feedback means for providing feedback that communicates with the second inverting input and the second non-inverting output; a third feedback means for providing feedback that communicates with the third non-inverting input and the first inverting output; a fourth feedback means for providing feedback that communicates with the third inverting input and the first non-inverting output; a fifth feedback means for providing feedback that communicates with the fourth inverting input and the first inverting output; and a sixth feedback means for providing feedback that communicates with the fourth non-inverting output and the first non-inverting output.

In other features, the first and second feedback means comprise first and second resistance means for providing resistance, respectively. The third and fourth feedback means comprise first and second resistance means for providing resistance, respectively. The fifth and sixth feedback means comprises first and second resistance means for providing resistance, respectively.

A Sigma-Delta analog to digital converter comprises the differential transimpedance amplifier. The Sigma-Delta analog to digital converter includes difference amplifier means for amplifying that includes one input that receives an input signal; integrator means for integrating that communicates with an output of the difference amplifier means; comparator means for comparing that receives an output of the integrator means; and digital to analog converter means for converting that communicates with an output of the comparator means and another input of the difference amplifier means.

In other features, filter and decimation means for filtering and decimating receives an output of the comparator means. At least one of the difference amplifier means, the integrator means and the comparator means includes the differential transimpedance amplifier.

A transimpedance amplifier comprises a first operational amplifier having an input and an output. A second operational amplifier has an input and an output that communicates with the input of the first operational amplifier. A first feedback element has one end that communicates with the input of the first operational amplifier and another end that communicates with the output of the first operational amplifier, wherein the first feedback element comprises a first capacitance. A second feedback element communicates with the input of the first operational amplifier and another end that communicates with the output of the first operational amplifier.

In other features, the second feedback element comprises a first resistance. The first capacitance includes a variable capacitance. The first feedback element comprises a first resistance in parallel with the first capacitance. The second feedback element comprises a first resistance in series with a first inductance. The first capacitance comprises a variable capacitance. A first resistance having one end that communicates with the another ends of the first and second feedback elements and another end that communicates with the output of the second operational amplifier. The first feedback element further comprises a first resistance in series with the first capacitance, and wherein the second feedback element comprises a first inductance in parallel with a second resistance. A differential amplifier comprises the transimpedance amplifier.

A Sigma-Delta analog to digital converter comprises the differential transimpedance amplifier. The Sigma-Delta analog to digital converter comprises a difference amplifier module that includes one input that receives an input signal; an integrator module that communicates with an output of the difference amplifier module; a comparator module that receives an output of the integrator module; and a digital to analog converter that communicates with an output of the comparator module and another input of the difference amplifier module.

In other features, a filter and decimation module receives an output of the comparator module. At least one of the difference amplifier module, the integrator module and the comparator module includes the differential transimpedance amplifier.

A transimpedance amplifier comprises first amplifying means for amplifying having an input and an output. Second amplifying means for amplifying having an input and an output that communicates with the input of the first amplifying means. First feedback means for providing feedback having one end that communicates with the input of the first amplifying means and another end that communicates with the output of the first amplifying means. The first feedback means comprises first capacitance means for providing capacitance. Second feedback means for providing feedback having one end that communicates with the input of the first amplifying means and another end that communicates with the output of the first amplifying means.

In other features, the second feedback means comprises first resistance means for providing resistance. The first capacitance means includes variable capacitance means for providing a variable capacitance. The first feedback means comprises first resistance means for providing resistance in parallel with the first capacitance means. The second feedback means comprises first resistance means for providing resistance in series with first inductance means for providing inductance. The first capacitance means comprises variable capacitance means for providing a variable capacitance. First resistance means for providing resistance having one end that communicates with the another ends of the first and second feedback means and another end that communicates with the output of the second amplifying means. The first feedback means further comprises first resistance means for providing resistance in series with the first capacitance means, and wherein the second feedback means comprises first inductance means for providing inductance in parallel with second resistance means for providing resistance. A differential transimpedance amplifier comprises the transimpedance amplifier.

A Sigma-Delta analog to digital converter comprises the differential transimpedance amplifier. The Sigma-Delta analog to digital converter includes difference amplifier means for amplifying that includes one input that receives an input signal; integrator means for integrating that communicates with an output of the difference amplifier means; comparator means for comparing that receives an output of the integrator means; and digital to analog converter means for converting that communicates with an output of the comparator means and another input of the difference amplifier means.

In other features, filter and decimation means for filtering and decimating receives an output of the comparator means. At least one of the difference amplifier means, the integrator means and the comparator means includes the differential transimpedance amplifier.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5 is a basic circuit architecture for a differential configuration of a TIA according to the prior art;

FIG. 6 shows an optical sensor, including a photodiode coupled to a TIA, according to the prior art;

DETAILED DESCRIPTION OF THE PREFERRED EMBODIMENTS

The following description of the preferred embodiment(s) is merely exemplary in nature and is in no way intended to limit the invention, its application, or uses.

Figure 15:
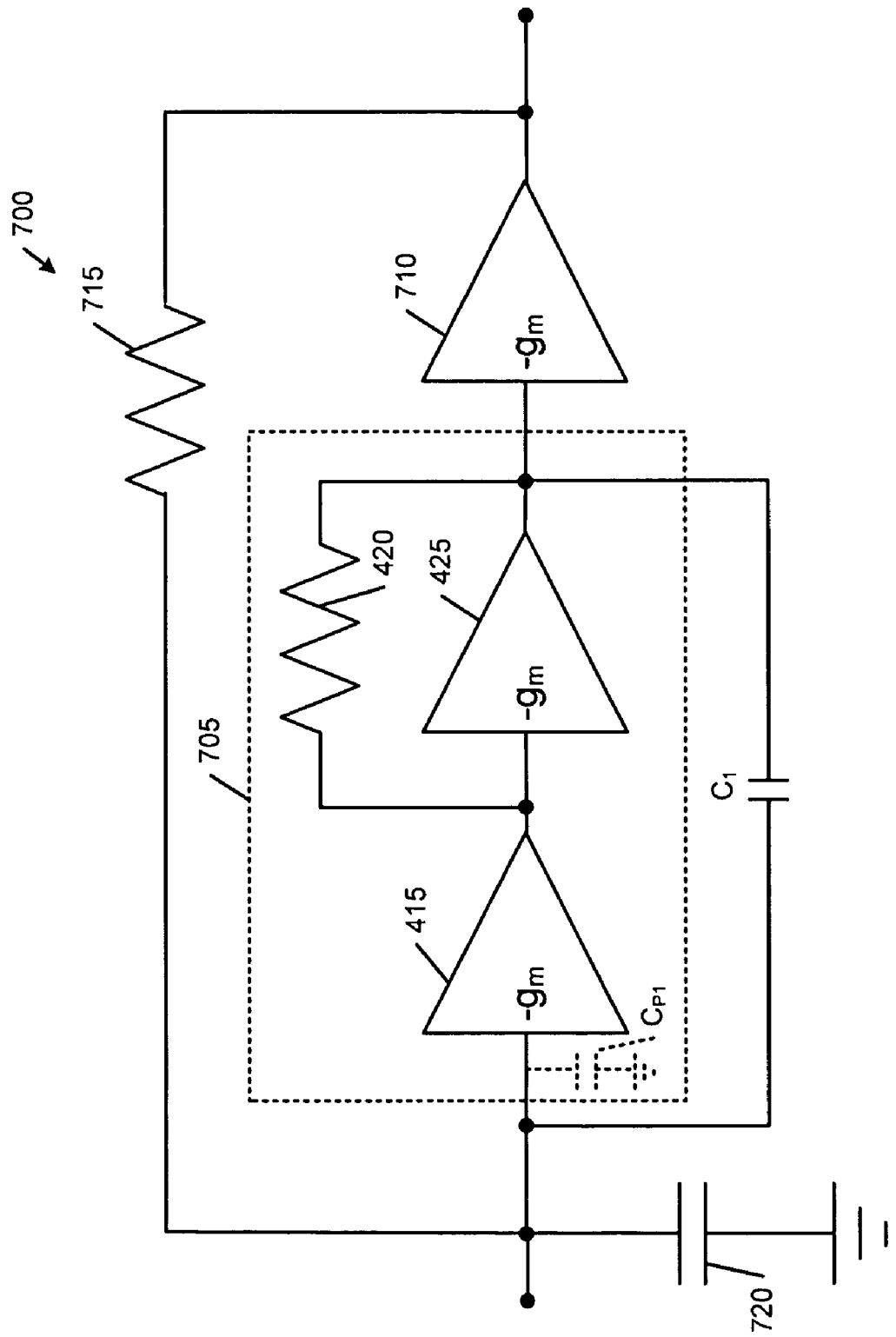
FIG. 15 is a first-order nested TIA with capacitive cancellation of input parasitic capacitance according to the present invention.
Figure 16:
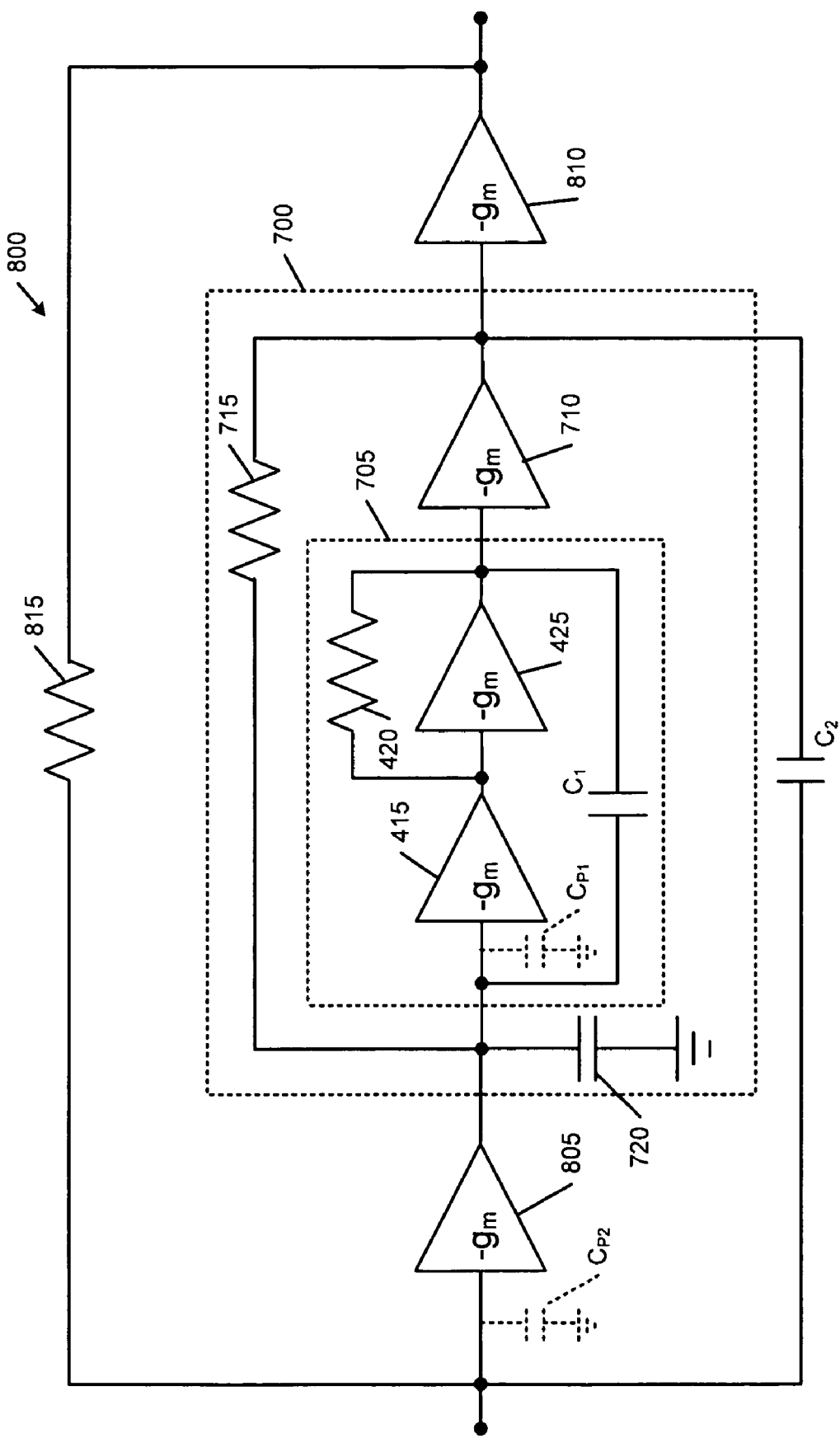
FIG. 16 is a second-order nested TIA with capacitive cancellation of input parasitic capacitance according to the present invention.
Figure 17:
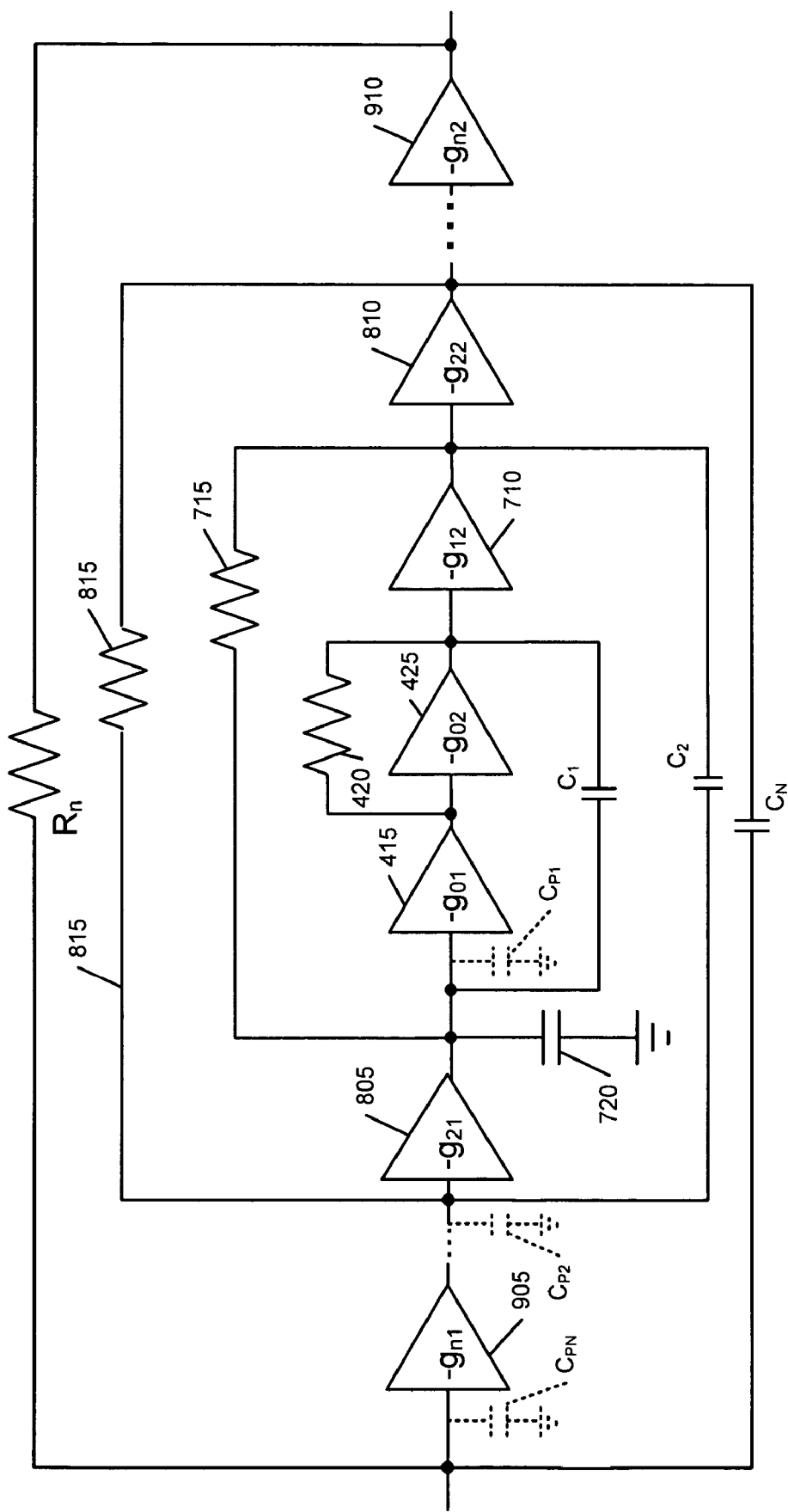
FIG. 17 is an nth-order nested TIA with capacitive cancellation of input parasitic capacitance according to the present invention.
Figure 23:
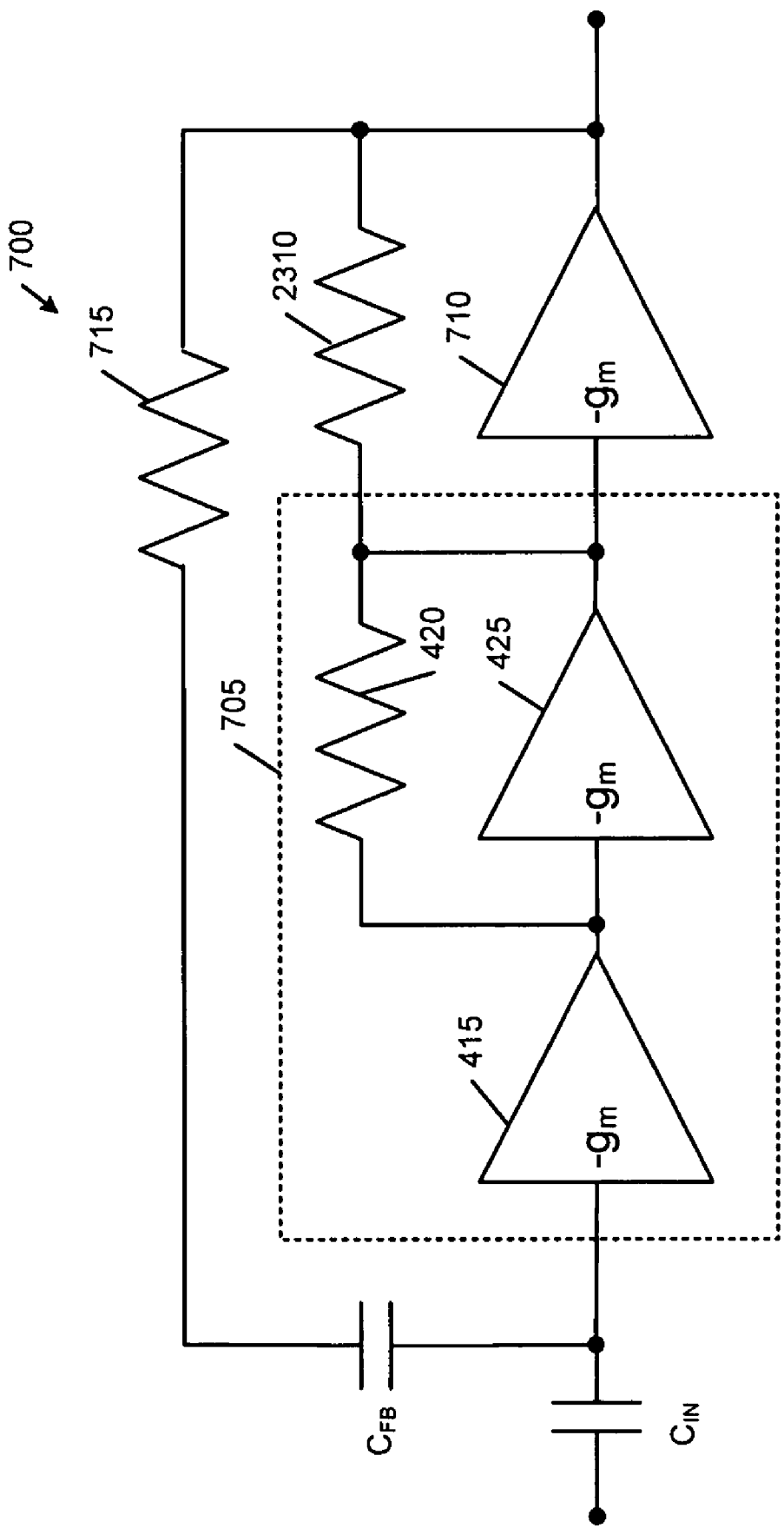
FIG. 23 illustrates the first order nested TIA of FIG. 7 with an additional input capacitance, feedback capacitance, and feedback resistance.
Figure 24:
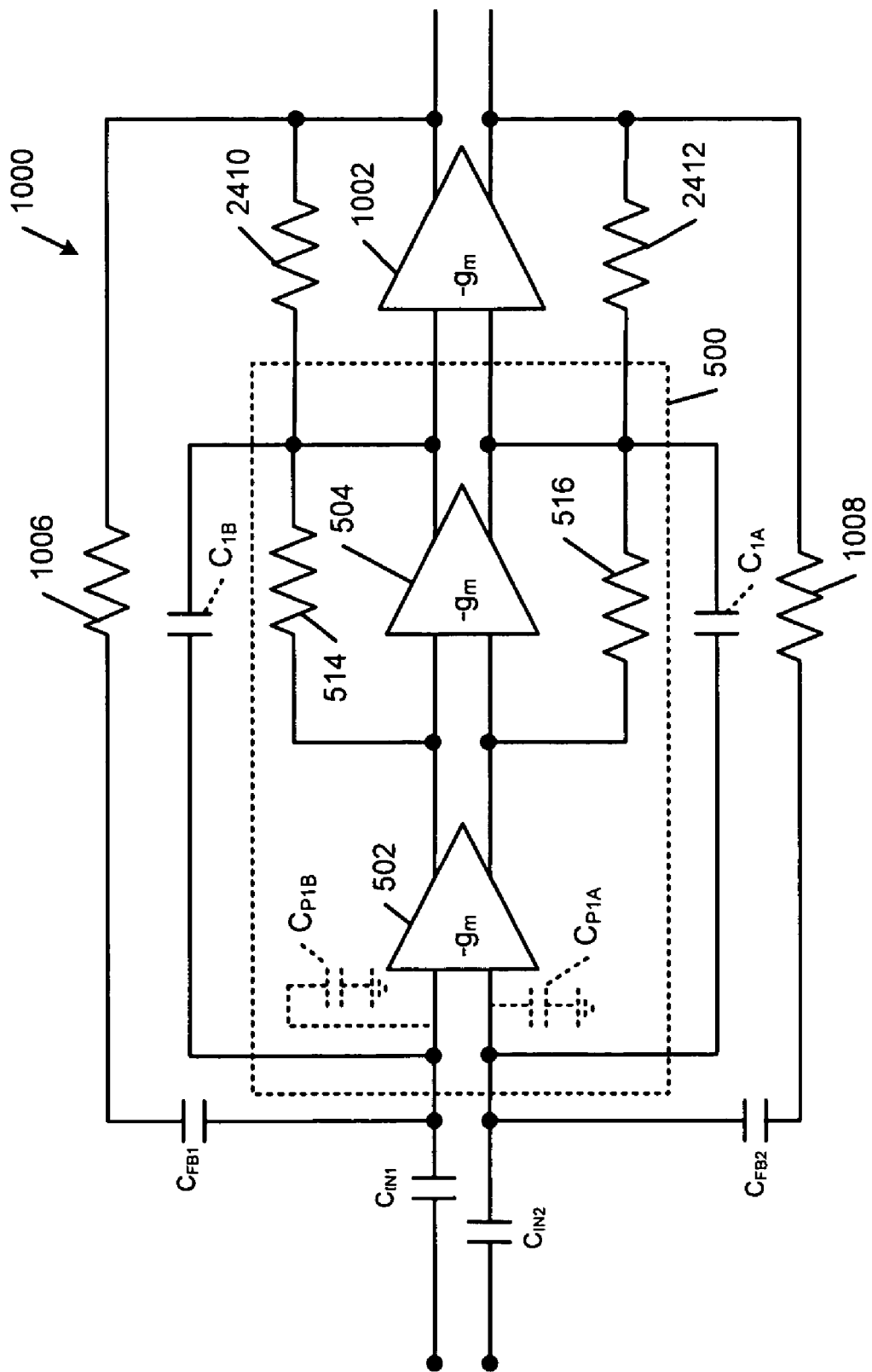
FIG. 24 illustrates the first order differential mode TIA of FIG. 10 with an additional input capacitance, feedback capacitance, and feedback resistance.

The present invention addresses the need for increasing the gain-bandwidth product of TIAs. Improvements in the gain-bandwidth product are achievable by "nesting" a TIA within another TIA. In other words, additional circuit elements such as feedback resistors, capacitors and/or opamps are added on the input and/or output sides of the TIA. In FIGS. 15-17, capacitive cancellation of the input parasitic capacitance is provided. In FIGS. 20-24, additional feedback resistance is provided. In FIGS. 23 and 24, input and/or feedback capacitance is provided.

Figure 7:
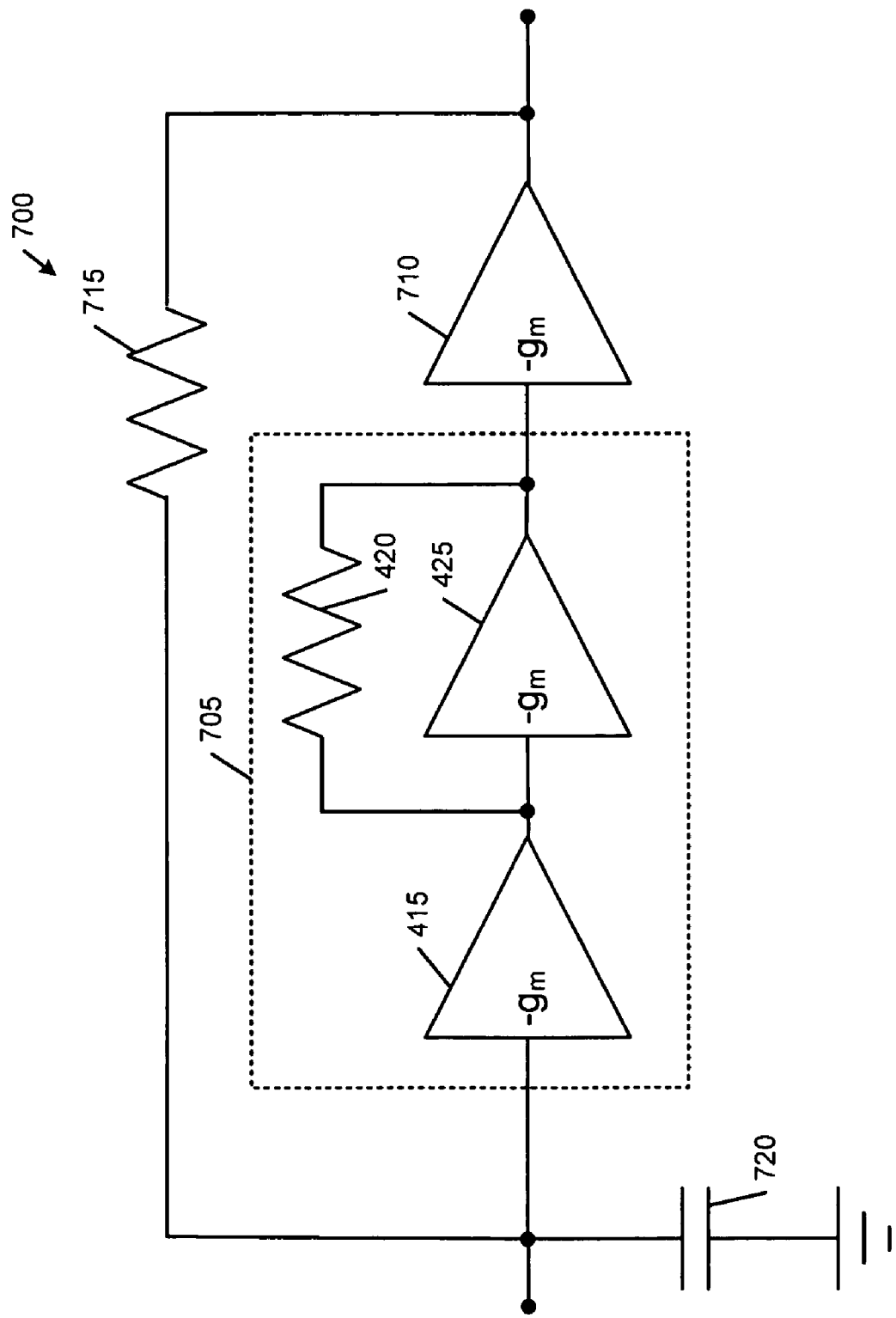
FIG. 7 is a first-order nested TIA according to the present invention.
Figure 8:
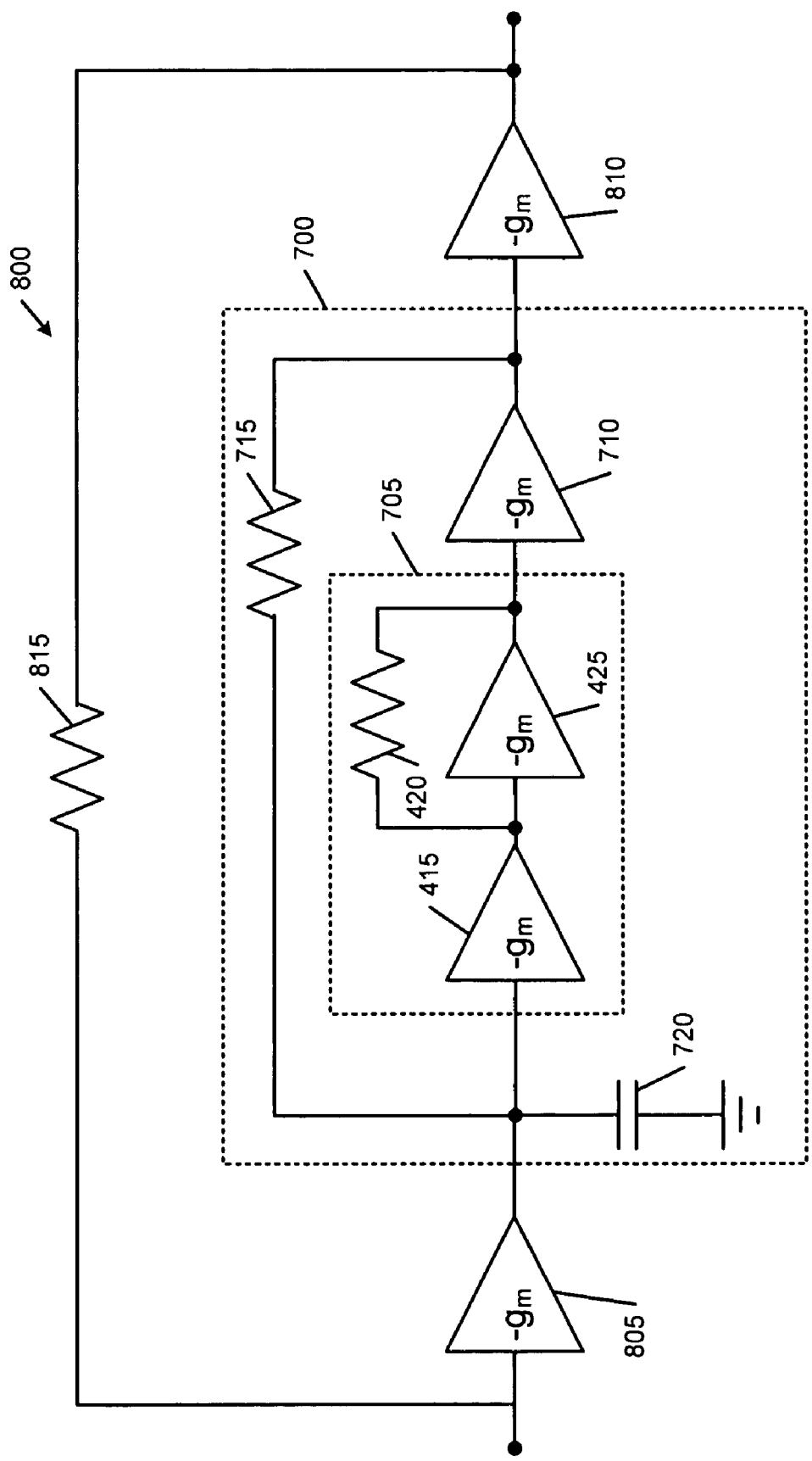
FIG. 8 is a second-order nested TIA according to the present invention.
Figure 9:
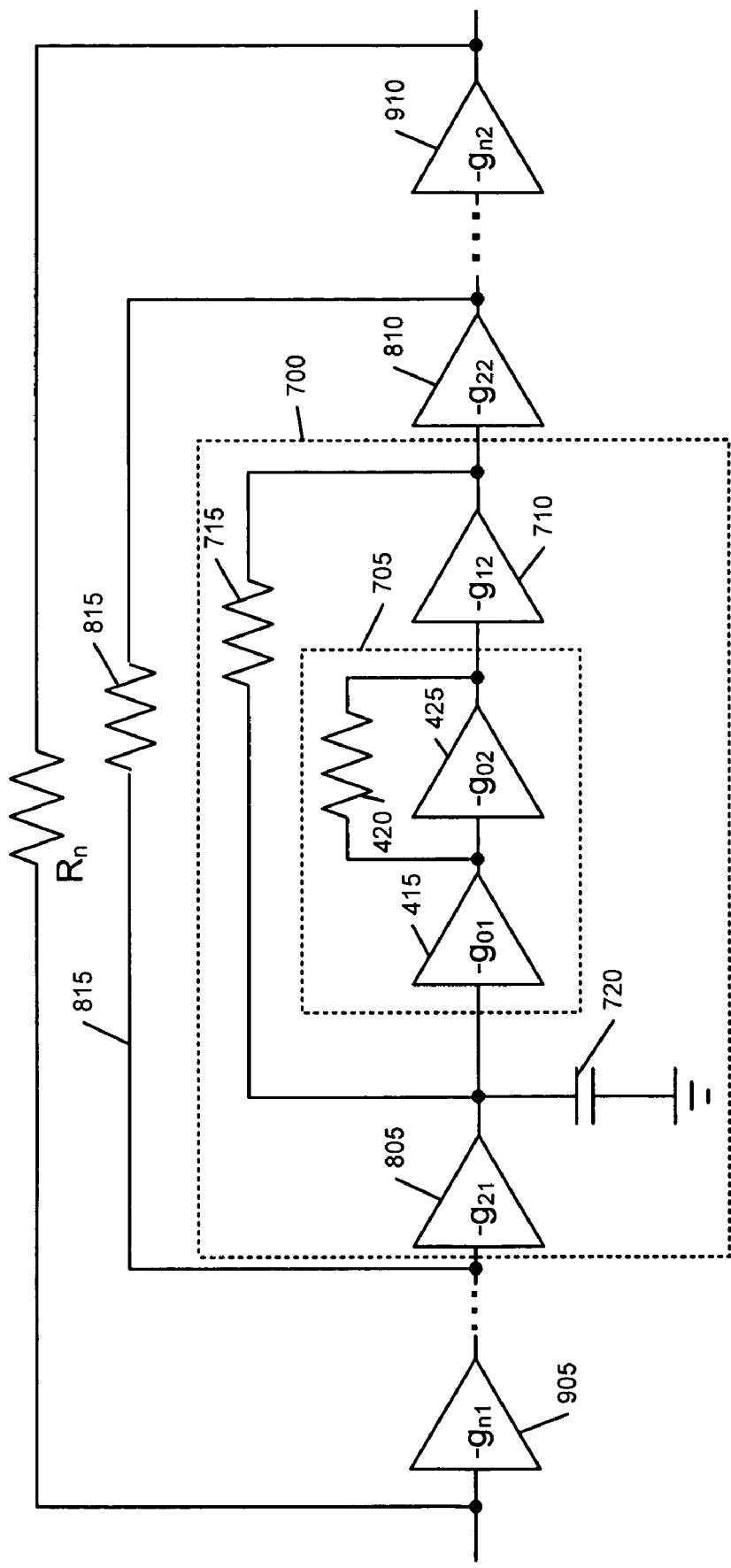
FIG. 9 is an nth-order nested TIA according to the present invention.
Figure 10:
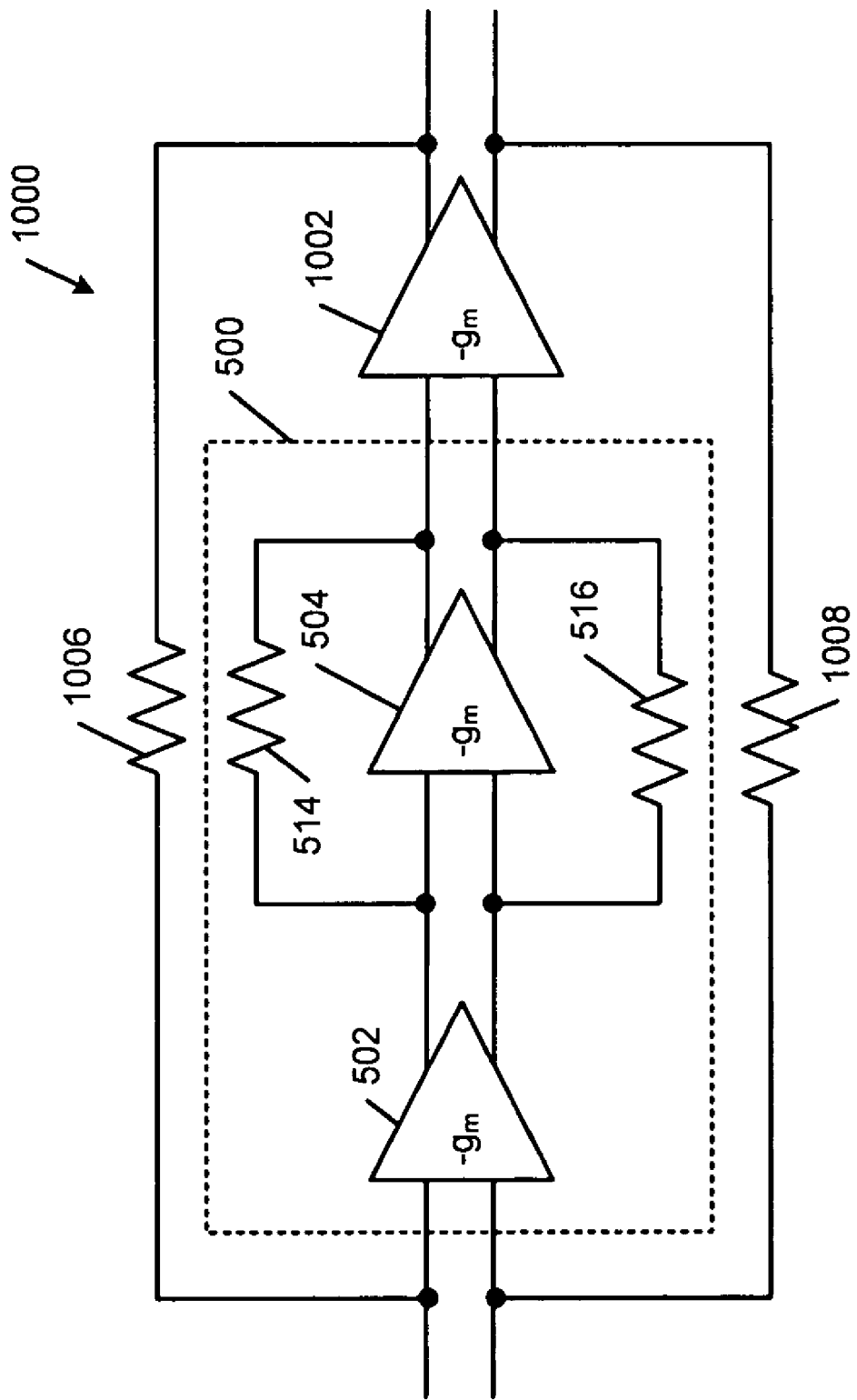
FIG. 10 is a first-order nested TIA in a differential configuration according to the present invention.
Figure 11:
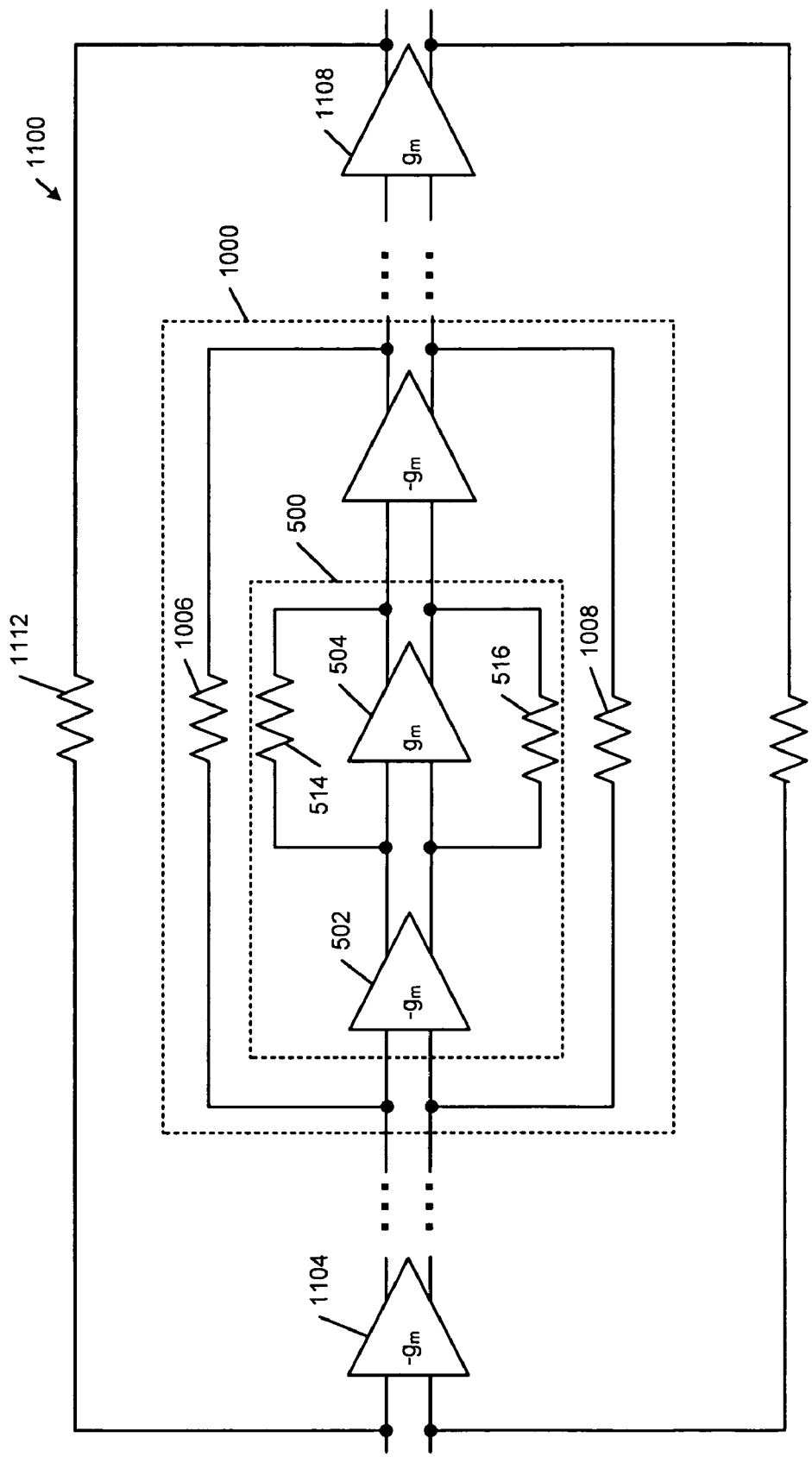
FIG. 11 is an nth-order nested TIA in a differential configuration according to the present invention.

Referring now to FIGS. 7, 8, and 9, a "nested" TIA is constructed by adding opamps, feedback resistors and/or capacitors to a zero-order TIA. In FIGS. 10 and 11, a nested TIA may also be constructed to operate in a differential mode.

Figure 2:
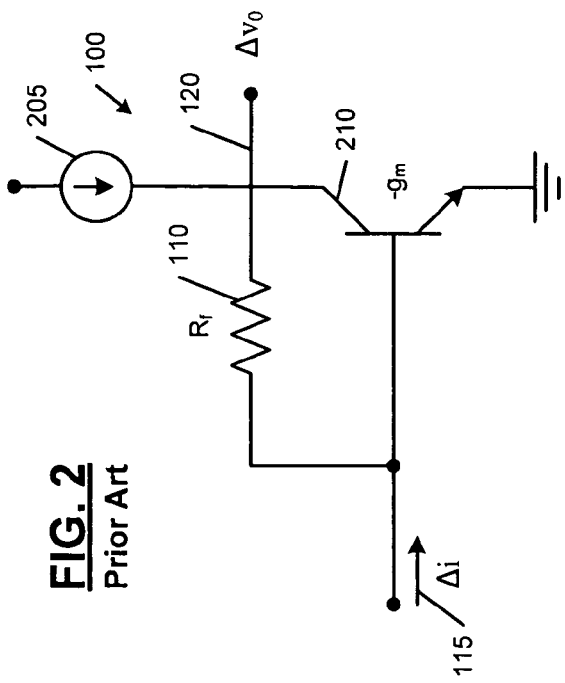
FIGS. 1 and 2 are basic circuit architectures for a current-to-voltage TIA according to the prior art.
Figure 4:
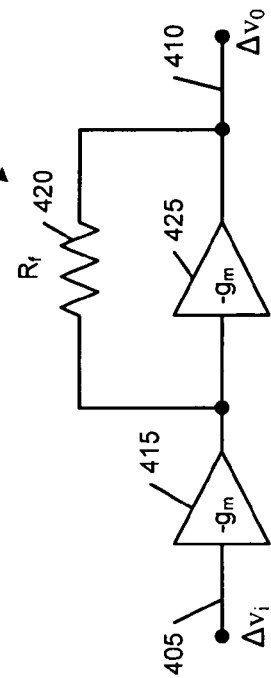
FIGS. 3 and 4 are basic circuit architectures for a voltage-to-voltage TIA according to the prior art.
Figure 1:
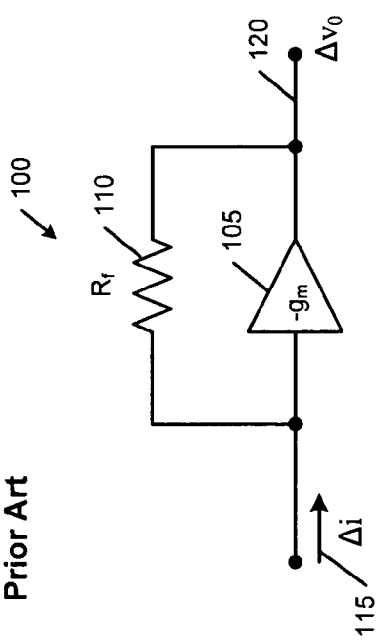
Figure 3:
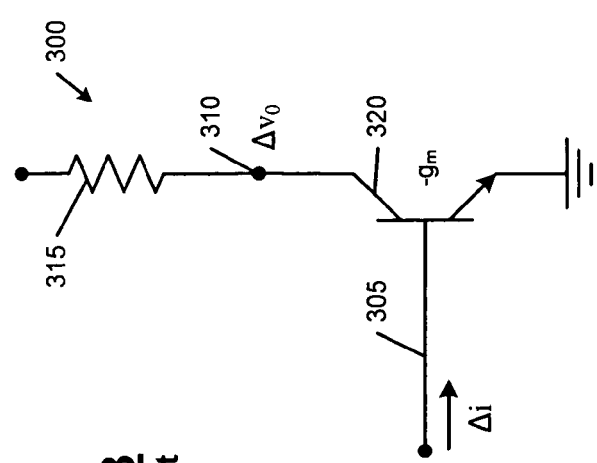

Referring back to FIG. 7, a first-order nested TIA 700 is shown. Reference numbers from FIG. 4 are used in FIG. 7 to identify similar elements. The TIA 700 includes a conventional TIA 705 (also referred to herein as a "zero-order" TIA), an opamp 710, and a feedback resistor 715. The feedback resistor 715 may be a standard fixed-value resistor, a nonlinear variable resistor, or an MOS resistor. A capacitor 720 is also connected between an input of the TIA 700 and ground (or virtual ground).

By nesting the TIA in this manner, improvements in the gain-bandwidth product may be realized. For example, the first-order nested TIA 700 that uses MOS transistors may achieve a bandwidth that is 10%-20% of the threshold frequency $f_T$. This range represents a bandwidth that is approximately five to ten times greater than the bandwidth of the corresponding zero-order TIA.

Figure 12:
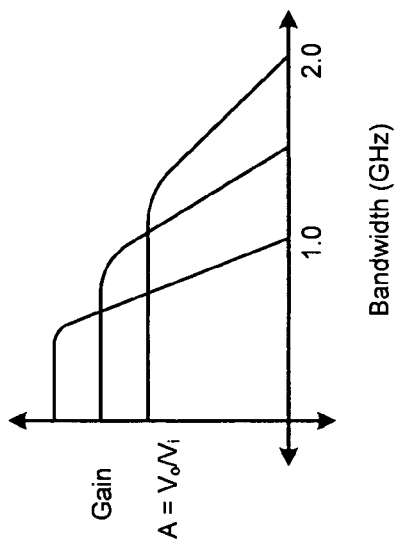
FIG. 12 is a graph of exemplary gain-bandwidth characteristics for a TIA.
Figure 13:
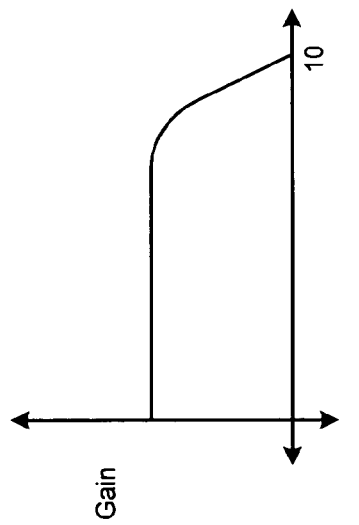
FIG. 13 is a graph of an exemplary gain-bandwidth characteristic for a first-order nested TIA.

Referring now to FIGS. 12 and 13, graphs illustrating characteristic gain-bandwidth curves for a zero-order TIA and a first-order nested TIA, respectively, are shown. In general, a higher value of gain is associated with a lower value of bandwidth, and a lower value of gain is associated with a higher value of bandwidth. The gain A, defined as the output voltage $\Delta v_o$ divided by the input voltage $\Delta v_i$, is typically on the order of a few hundred or a few thousand (i.e., approximately $10^2$-$10^3$). A typical range of threshold frequency ($f_T$) values for a 0.13 μm CMOS process is 30 GHz-40 GHz.

In FIG. 12, three exemplary characteristic curves are shown. A high gain value yields a bandwidth value of approximately 1 GHz. A medium gain value increases the bandwidth to approximately 2 GHz. Other values of gain and bandwidth are possible. For example, a TIA may have a characteristic gain value that is higher than the maximum shown in FIG. 12 and a bandwidth that is less than 1 GHz. A TIA may have a characteristic gain value that is lower than the minimum gain value shown in FIG. 12 and a bandwidth that is greater than 2 GHz. As can be appreciated, the bandwidth varies as an inverse function of gain. This function may be referred to as the "spread". The spread is greater for TIAs using MOS transistors than for TIAs using bipolar junction transistors (BJTs). Thus, the need to improve the TIA bandwidth performance is more pronounced with MOS transistors than with BJT transistors.

The exemplary bandwidth values shown in FIG. 12 do not define upper and lower bandwidth bounds. In many practical applications, bandwidths on the order of 1 GHz or 2 GHz are too low. Many applications, such as an OC192 fiber optic receiver, require bandwidths on the order of 10 GHz. Preamplifiers for high-speed hard disk drives also typically require bandwidths that are on the order of several GHz. Referring now to FIG. 13, a first-order nested TIA at a typical gain value may have a bandwidth of approximately 10 GHz.

Figure 14:
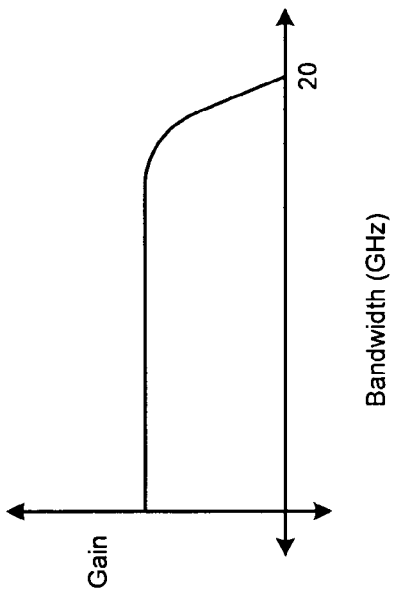
FIG. 14 is a graph of an exemplary gain-bandwidth characteristic for a second-order nested TIA.

Referring now to FIG. 8, a second-order nested TIA 800 builds upon the first-order nested TIA 700. Reference numbers from FIGS. 4 and 7 are used in FIG. 8 to identify similar elements. The second-order nested TIA 800 includes an opamp 805 at the input of the first-order nested TIA 700 and an opamp 810 at the output of the first-order nested TIA 700. An additional feedback resistor 815 is also added across the input of the opamp 805 and the output of the opamp 810. An exemplary gain-bandwidth curve that is produced using the second-order nested TIA 800 is shown in FIG. 14. For a typical gain value, a bandwidth of approximately 20 GHz may be achieved.

Referring now to FIG. 9, higher-order nested TIAs may be constructed by adding additional opamps and feedback resistors. Reference numbers from FIGS. 4, 7 and 8 are used in FIG. 9 to identify similar elements. For example, a third-order nested TIA 900 includes opamps 905 and 910 and feedback resistor 915. It is possible to achieve higher values of either gain or bandwidth (or both) by repeating the technique of the present invention. However, the efficiency of the circuit decreases as additional nesting levels are added due to parasitic noise and increased power dissipation. In general, either the first-order nested TIA or the second-order nested TIA will usually provide sufficient performance.

Referring now to FIG. 10, a differential mode first-order nested TIA 1000 is shown. Reference numbers from FIG. 5 are used in FIG. 10 to identify similar elements. An opamp 1002 is connected to the outputs of the opamp 504. Feedback resistors 1006 and 1008 are connected to inputs of the differential mode TIA 500 and to outputs of the opamp 1002. The gain-bandwidth product of the TIA is increased.

Referring now to FIG. 11, a differential mode nth-order nested TIA 1100 is constructed in a manner that is similar to the nth-order nested TIA of FIG. 9. Reference numbers from FIGS. 5 and 10 are used in FIG. 11 to identify similar elements. Additional opamps 1104 and 1108 and feedback resistors 1112 and 1114 are connected in a similar manner. The gain-bandwidth characteristics for differential mode TIAs are substantially similar to the gain-bandwidth characteristics shown in FIGS. 12-14.

It is noted that the opamps used in the nested TIA may employ either bipolar junction transistors (BJTs), such as gallium-arsenide (GaAs) transistors, or metal-oxide-semiconductor (MOS) transistors, such as CMOS or BICMOS transistors. The preferred embodiments of the invention use MOS transistors due to practical considerations such as ease of manufacture and better power consumption characteristics.

Referring now to FIG. 15, the first order nested TIA 700 is shown with additional feedback capacitance $C_1$, which substantially cancels effects of an input capacitance $C_{P1}$ at the input of the opamp 415. The feedback capacitance $C_1$ has a first end that communicates with an input of the opamp 415 and a second end that communicates with an output of the opamp 425.

Referring now to FIG. 16, the second order nested TIA 800 of FIG. 8 is shown with additional feedback capacitances $C_1$ and $C_2$, which substantially cancel effects of input capacitances $C_{P1}$ and $C_{P2}$ at the inputs of opamps 415 and 805 respectively. The feedback capacitance $C_1$ has a first end that communicates with an input of the opamp 415 and a second end that communicates with an output of the opamp 425. The feedback capacitance $C_2$ has a first end that communicates with an input of the opamp 805 and a second end that communicates with an output of the opamp 710.

Referring now to FIG. 17, the nth order nested TIA of FIG. 9 is shown with additional feedback capacitances $C_1$, $C_2$, . . . , and $C_N$, which substantially cancel effects of input capacitances $C_{P1}$, $C_{P2}$, . . . , and $C_{PN}$ at the inputs of opamps 415, 805 and 905, respectively. The feedback capacitance $C_1$ has a first end that communicates with an input of the opamp 415 and a second end that communicates with an output of the opamp 425. The feedback capacitance $C_2$ has a first end that communicates with an input of the opamp 805 and a second end that communicates with an output of the opamp 710. The feedback capacitance $C_N$ has a first end that communicates with an input of the opamp 905 and a second end that communicates with an output of the opamp 810.

Figure 18:
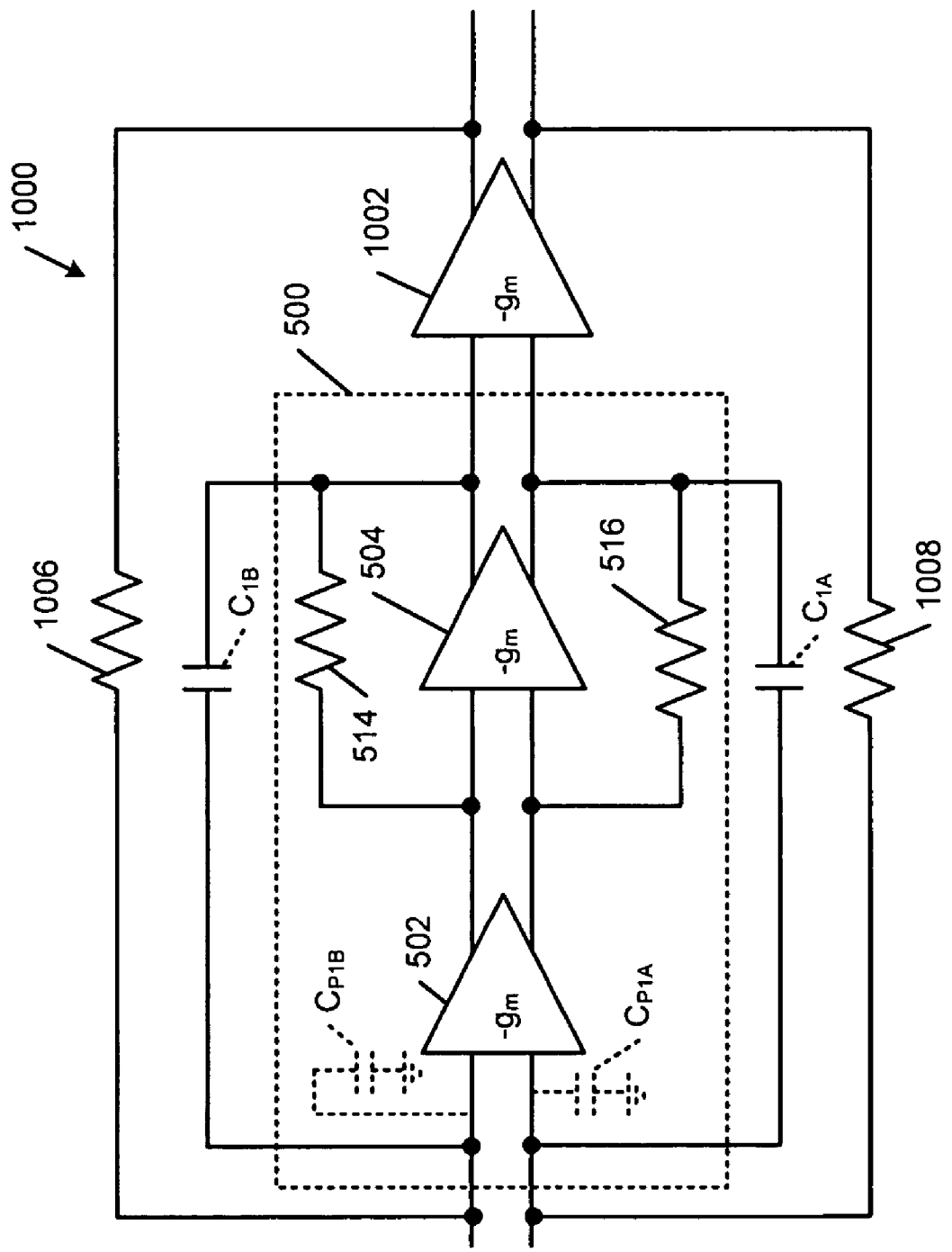
FIG. 18 is a first-order nested TIA in a differential configuration with capacitive cancellation of input parasitic capacitance according to the present invention.
Figure 19:
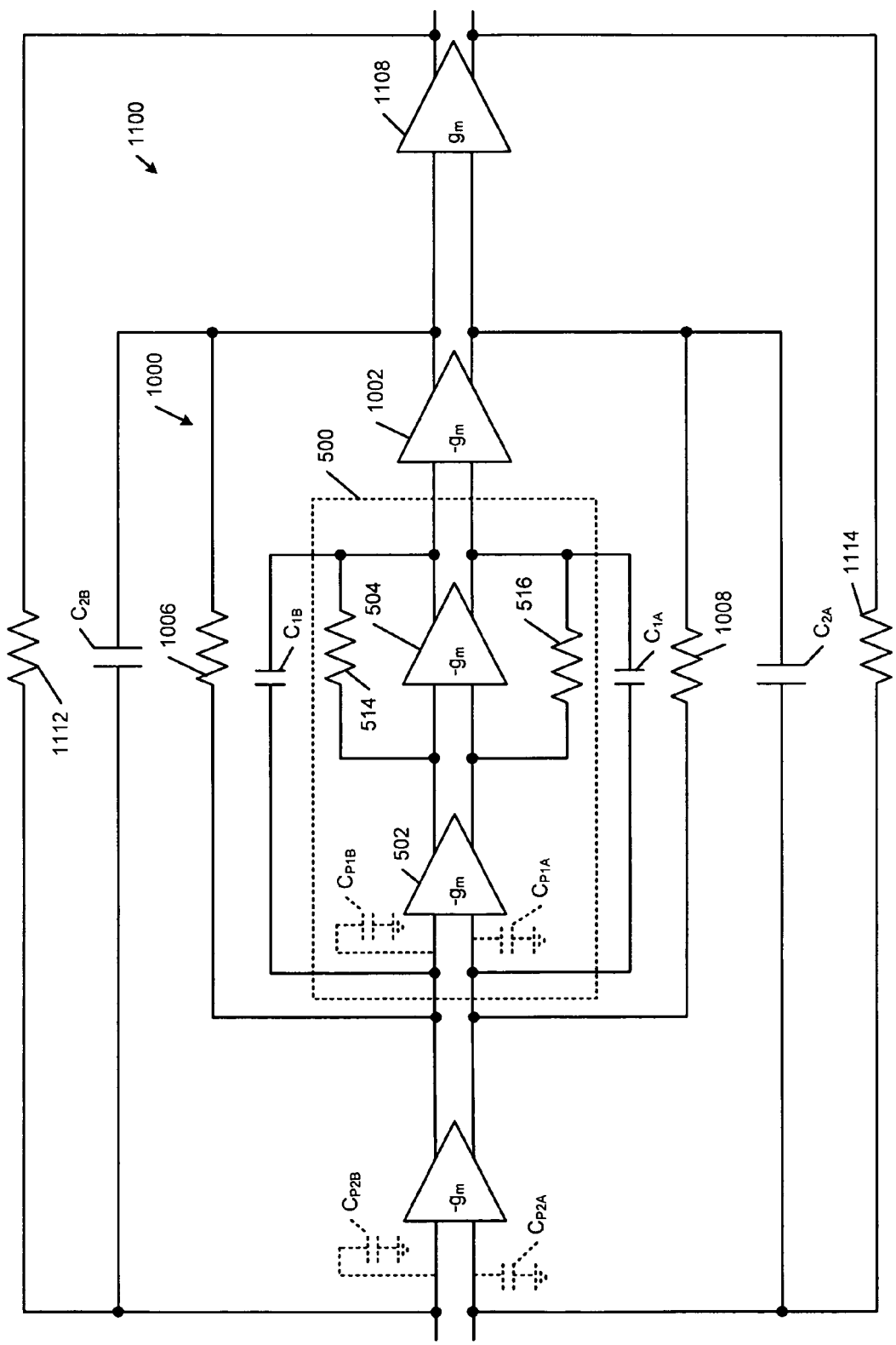
FIG. 19 is a second order nested TIA in a differential configuration with capacitive cancellation of input parasitic capacitance according to the present invention.
Figure 20:
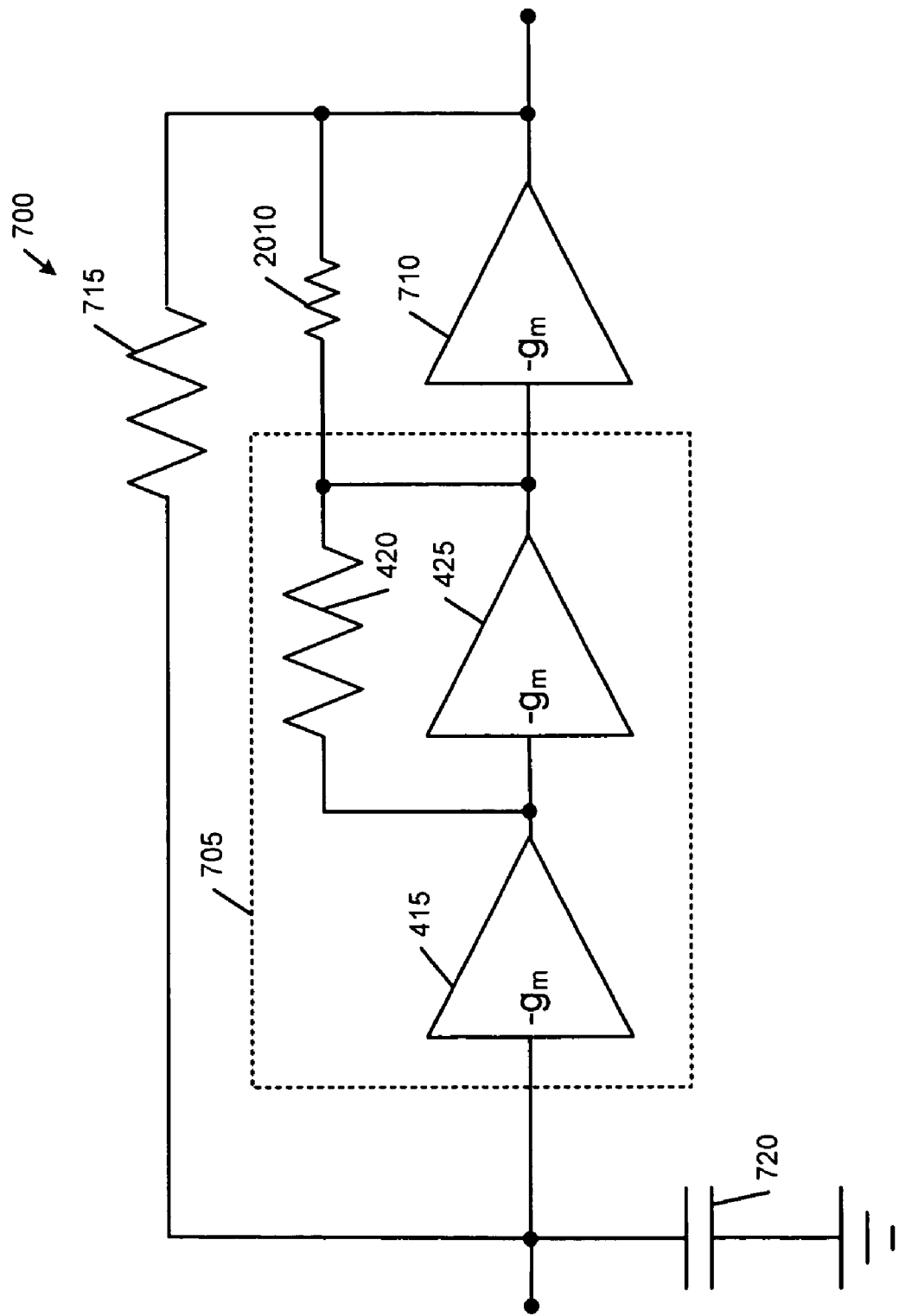
FIG. 20 illustrates the first order nested TIA of FIG. 7 with additional feedback resistance.

Referring now to FIG. 18, the first order nested differential mode TIA 1000 is shown with additional feedback capacitors $C_{1A}$ and $C_{1B}$, which substantially cancel effects of input parasitic capacitances $C_{P1}$ and $C_{P2}$ at the inputs of the differential mode opamp 502. The feedback capacitance $C_{1A}$ has a first end that communicates with an input of the differential mode opamp 502 and a second end that communicates with an output of the differential mode opamp 504. In FIG. 19, additional capacitances $C_{2A}$ and $C_{2B}$ are added to a second order differential mode TIAs in a similar manner to offset parasitic capacitances $C_{P2A}$ and $C_{P2B}$. Higher order circuits use a similar approach.

Referring back to FIG. 20, the first order nested TIA of FIG. 7 is shown with additional feedback resistance 2010. The feedback resistance 2010 has a first end that communicates with an input of the opamp 710. A second end of the resistance 2010 communicates with an output of the opamp 710.

Figure 21:
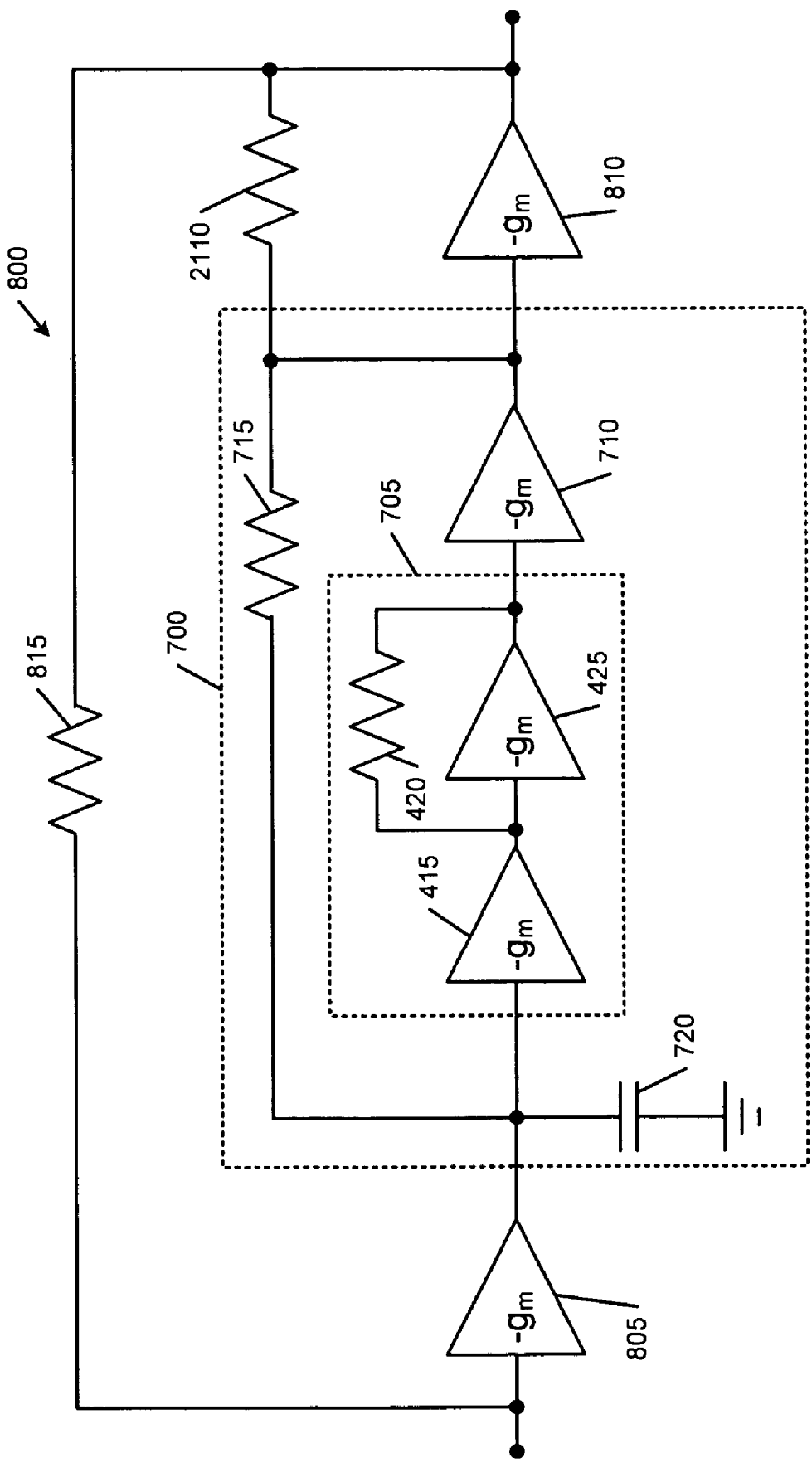
FIG. 21 illustrates a second order nested TIA of FIG. 8 with additional feedback resistance.

Referring now to FIG. 21, the second order nested TIA of FIG. 8 is shown with additional feedback resistance 2110. The feedback resistance 2110 has a first end that communicates with an input of the opamp 810. A second end of the resistance 2110 communicates with an output of the opamp 810.

Figure 22:
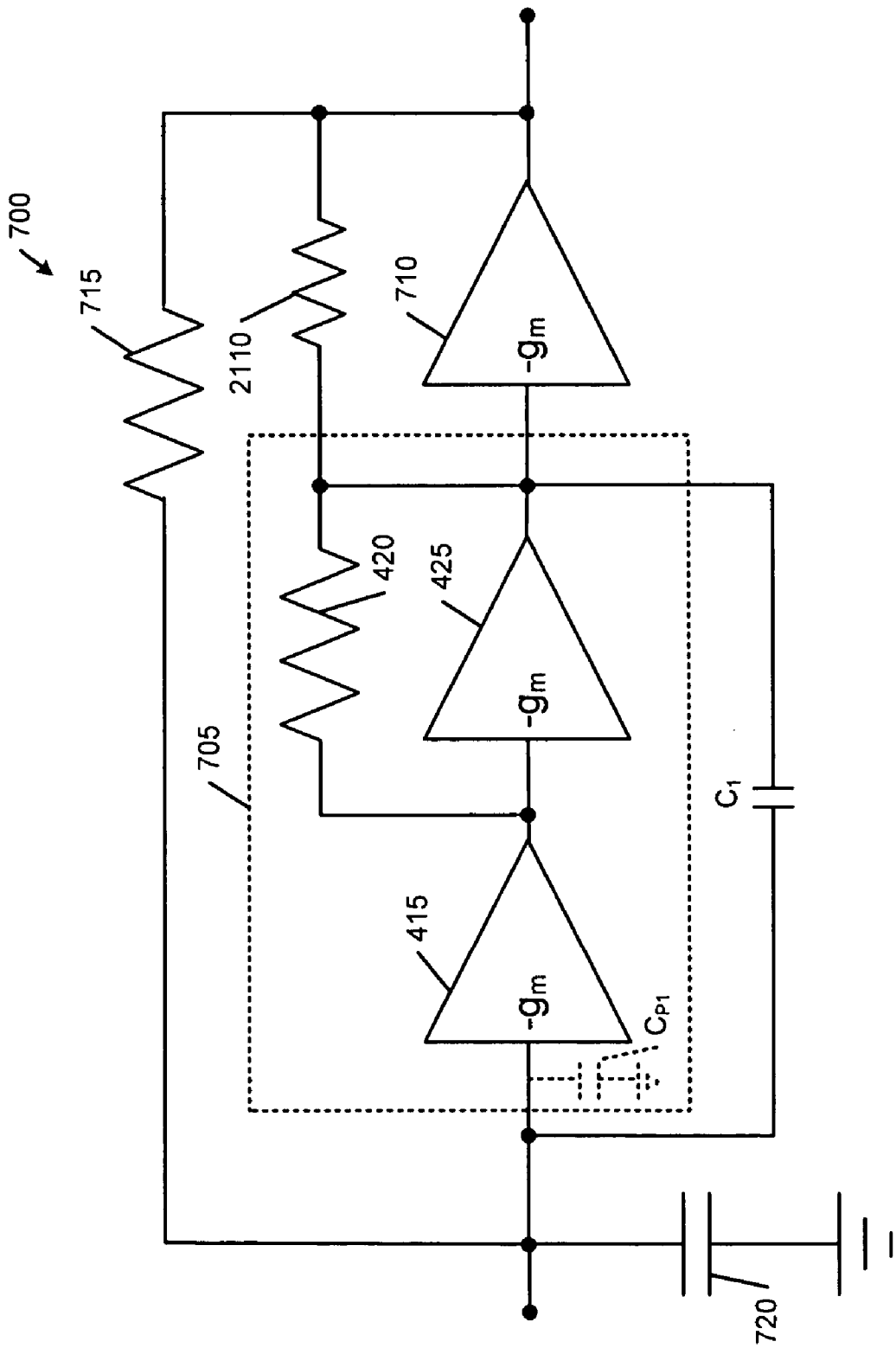
FIG. 22 illustrates the first order nested TIA of FIG. 15 with additional feedback resistance.

Referring now to FIG. 22, the first order nested TIA of FIG. 15 is shown with additional feedback resistance 2210. The feedback resistance 2210 has a first end that communicates with an input of the opamp 710. A second end of the resistance 2210 communicates with an output of the opamp 710.

Referring now to FIG. 23, the first order nested TIA of FIG. 7 is shown with input capacitance $C_{IN}$, feedback capacitance $C_{FB}$, and feedback resistance 2310. The input capacitance $C_{IN}$ has a first end that receives an input signal for the nested TIA 700 and a second end that communicates with an input of opamp 415. The feedback capacitance $C_{FB}$ has a first end that communicates with an input of opamp 415 and a second end that communicates with one end of resistance 715.

The additional feedback resistances, input capacitances, and/or feedback capacitances can also be added to the differential mode nested TIA. Referring now to FIG. 24, the first order differential mode nested TIA of FIG. 10 is shown with first and second input capacitances $C_{IN1}$ and $C_{IN2}$, first and second feedback capacitances $C_{FB1}$ and $C_{FB2}$, and feedback resistances 2410 and 2412. The input capacitances $C_{IN1}$ and $C_{IN2}$ have first ends that receive input signals for the nested differential mode TIA and second ends that communicate with inputs of opamp 502. The feedback capacitances $C_{FB1}$ and $C_{FB2}$ have first ends that communicate with inputs of opamp 502 and second ends that communicate with first ends of resistances 1006 and 1008, respectively. First and second feedback resistances 2410 and 2412 have first ends that are connected to inputs and second ends that are connected to outputs of differential mode opamp 1002.

As can be appreciated, the feedback capacitances (FIGS. 15-19), feedback resistances (FIGS. 20-24), and input and feedback capacitances (FIGS. 23 and 24) can be used in any combination on first, second, . . . or $n^{th}$ order nested TIA and/or differential mode TIA.

Figure 25:
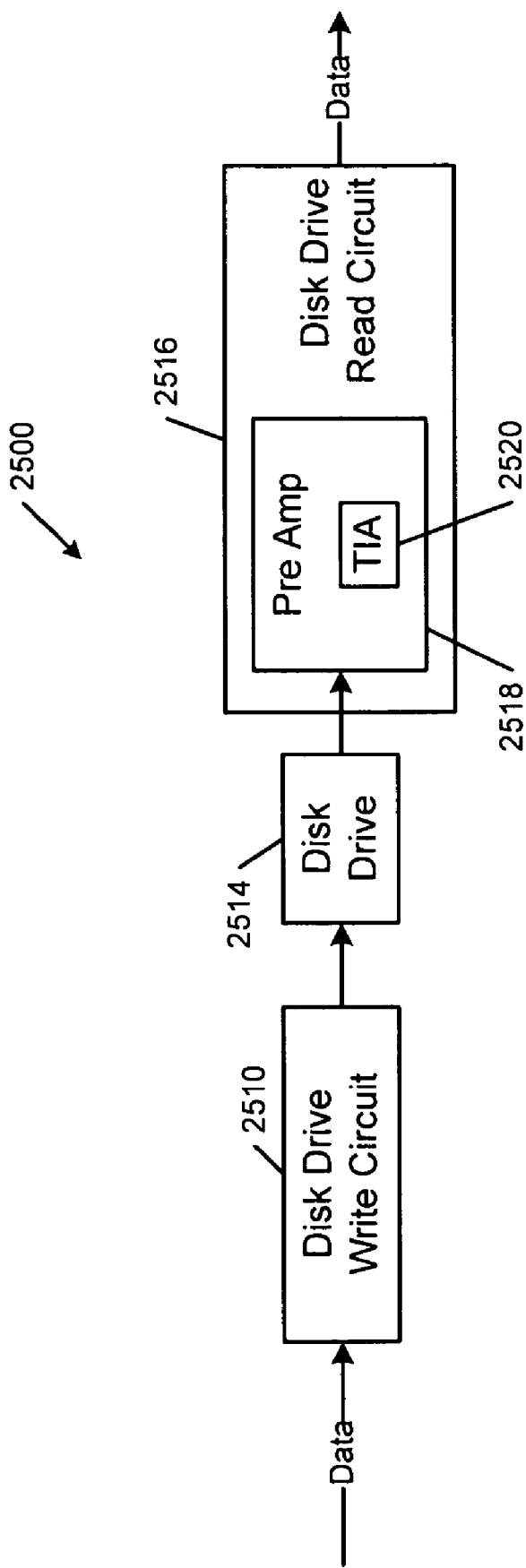
FIG. 25 illustrates an exemplary disk drive system including a preamplifier with a nested TIA according to the present invention.

Referring now to FIG. 25, an exemplary disk drive system 2500 is shown to include a disk drive write circuit 2510 that writes to a disk drive 2514. A disk drive read circuit 2516 includes a preamp circuit 2518 with a nested TIA or nested differential mode TIA identified at 2520, which is implemented as described above.

Figure 26:
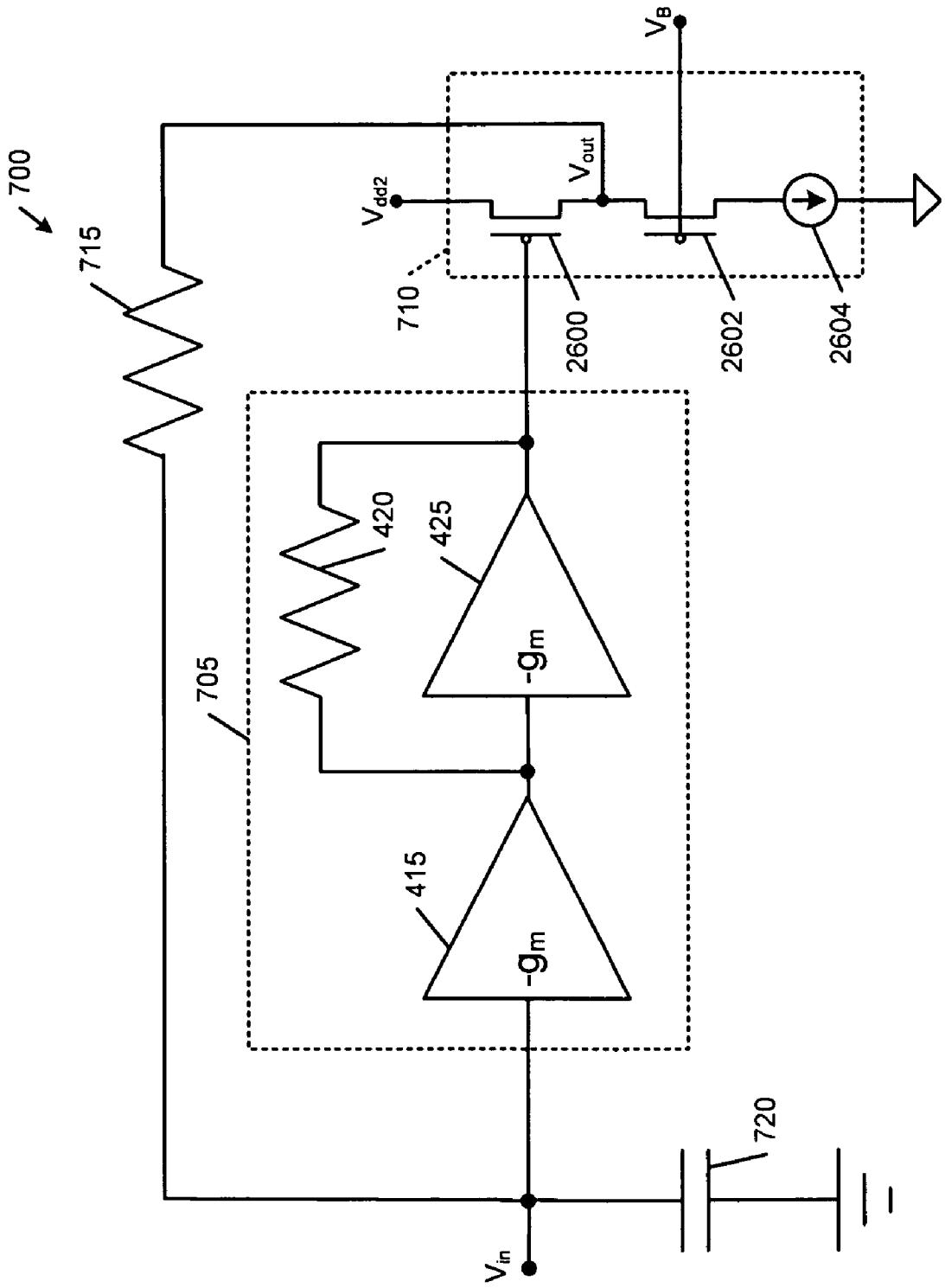
FIG. 26 illustrates the first order nested TIA of FIG. 7 including an opamp of a first configuration.

Referring now to FIG. 26, the first-order nested TIA 700 of FIG. 7 is shown including a first implementation of opamp 710. Opamp 710 includes a first transistor 2600 in series with a second transistor 2602. A gate of the first transistor 2600 is driven by the output of the zero-order TIA 705. A gate of the second transistor 2602 is driven by a bias voltage $V_B$. The signal output of TIA 700 is taken at a node connecting a source of the first transistor 2600 with a drain of the second transistor 2602. A first current source 2604 draws current from a source of the second transistor 2602. The opamp 710 can be powered with a drain supply voltage $V_{dd2}$. Power supply options are described below in more detail.

Figure 27:
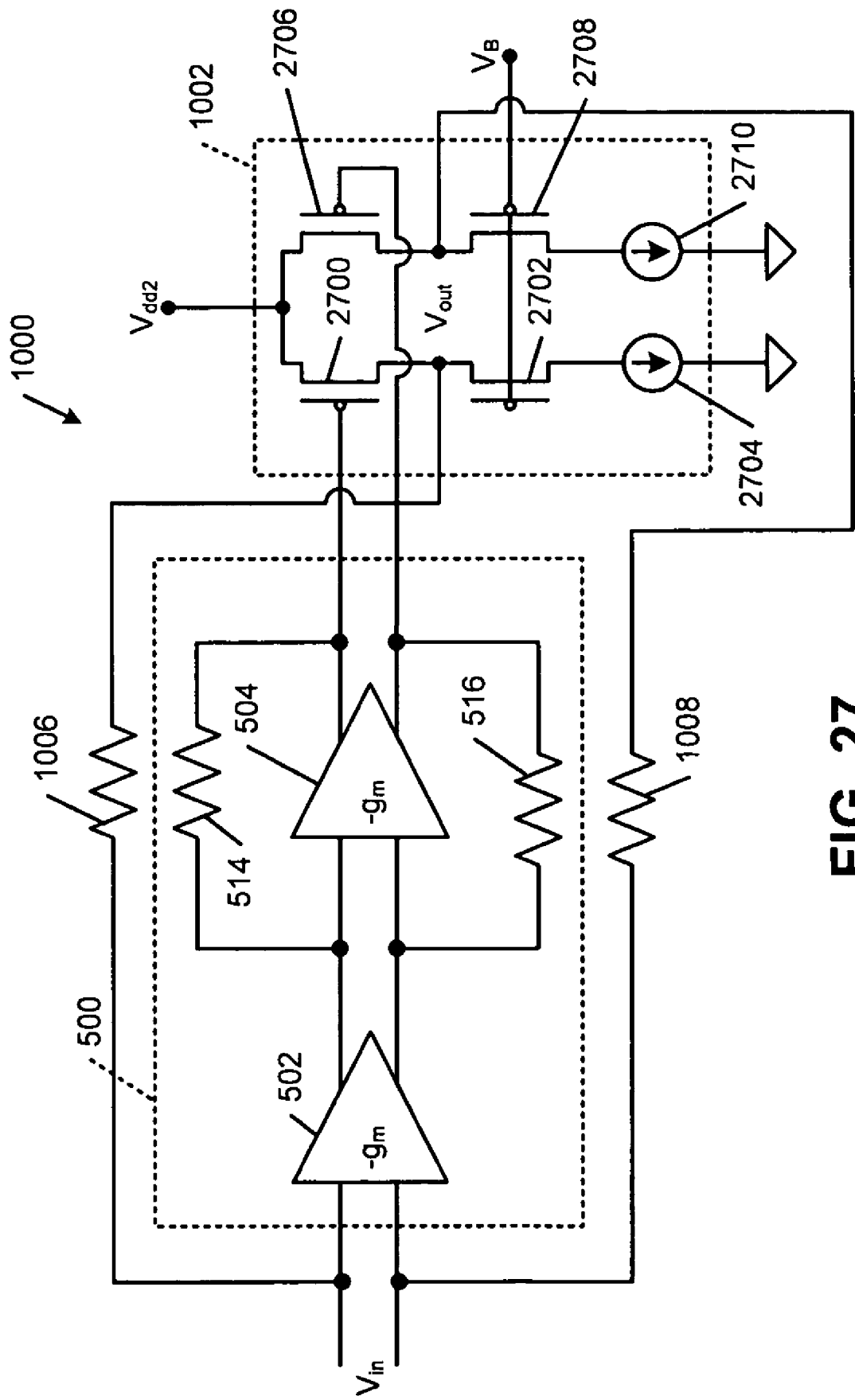
FIG. 27 illustrates the differential first-order nested TIA of FIG. 10 including an differential opamp of the first configuration.

Referring now to FIG. 27, the differential mode first-order nested TIA 1000 of FIG. 10 is shown including a first implementation of opamp 1002. Opamp 1002 includes a first transistor 2700 in communication with a second transistor 2702. A gate of the first transistor 2700 is driven by one output of the differential zero-order TIA 500. A gate of the second transistor 2702 is driven by a bias voltage $V_B$. A first signal output of TIA 1000 is taken at a node connecting a source of the first transistor 2600 with a drain of the second transistor 2702. A first current source 2704 draws current from a source of the second transistor 2702.

A third transistor 2706 is in communication with a fourth transistor 2708. A gate of the third transistor 2706 is driven by the other output of the differential zero-order TIA 500. A gate of the fourth transistor 2708 is driven by $V_B$. A second signal output of TIA 1000 is taken at a node connecting a source of the third transistor 2706 with a drain of the fourth transistor 2708. A second current source 2710 draws current from a source of the second transistor 2702. The opamp 1002 can be powered with a drain supply voltage $V_{dd2}$. Power supply options are described below in more detail. The differential signal output is taken across the first and second signal outputs at the respective sources of first and third transistors 2700, 2706.

Figure 28:
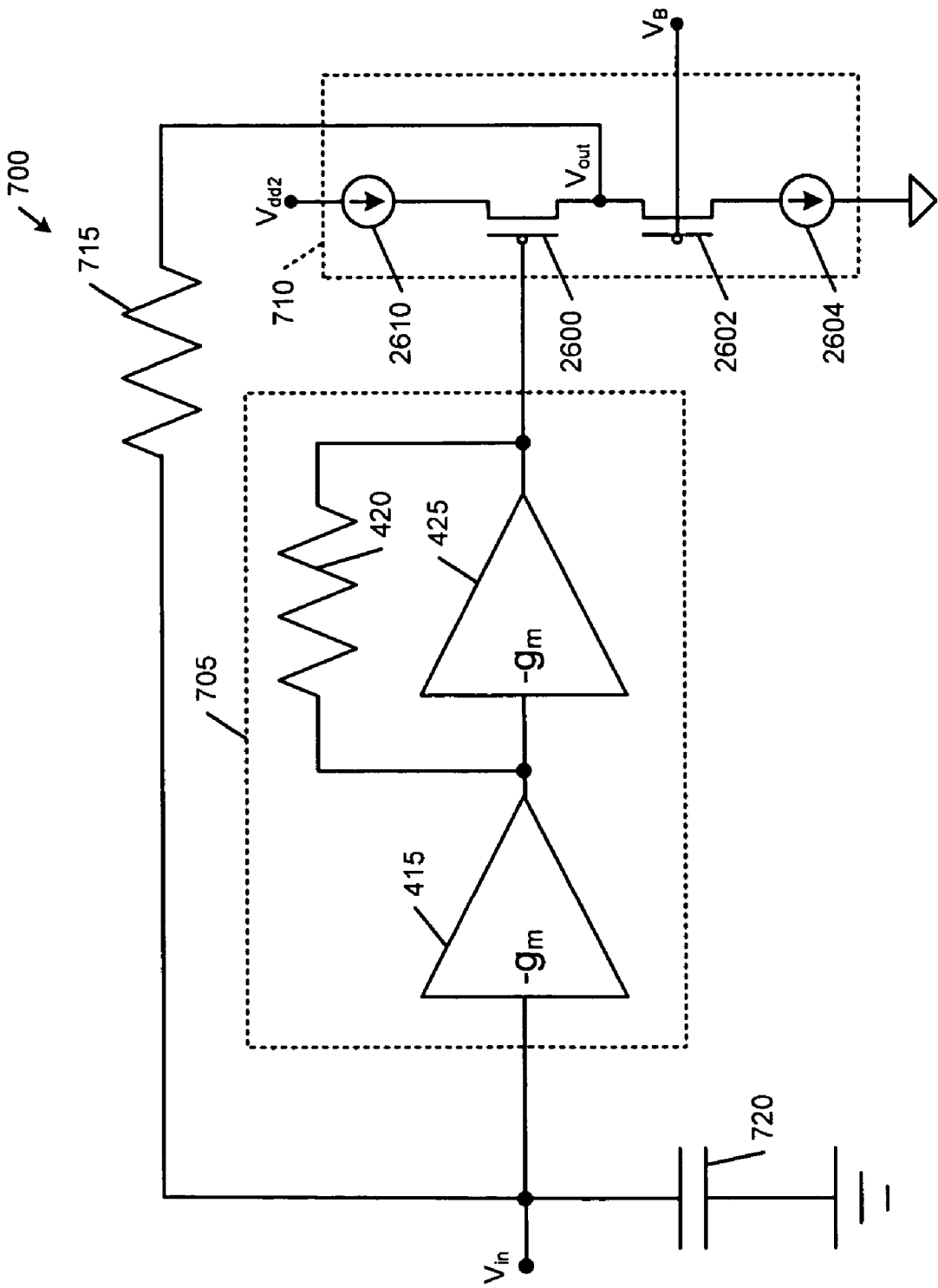
FIG. 28 illustrates the first order nested TIA of FIG. 26 including an opamp of a second configuration.

Referring now to FIG. 28, the first-order nested TIA 700 of FIG. 26 is shown including a second implementation of opamp 710. The second implementation includes a second current source 2610 that provides current to the drain of the first transistor 2600. The second current source 2610 draws current from $V_{dd2}$.

Figure 29:
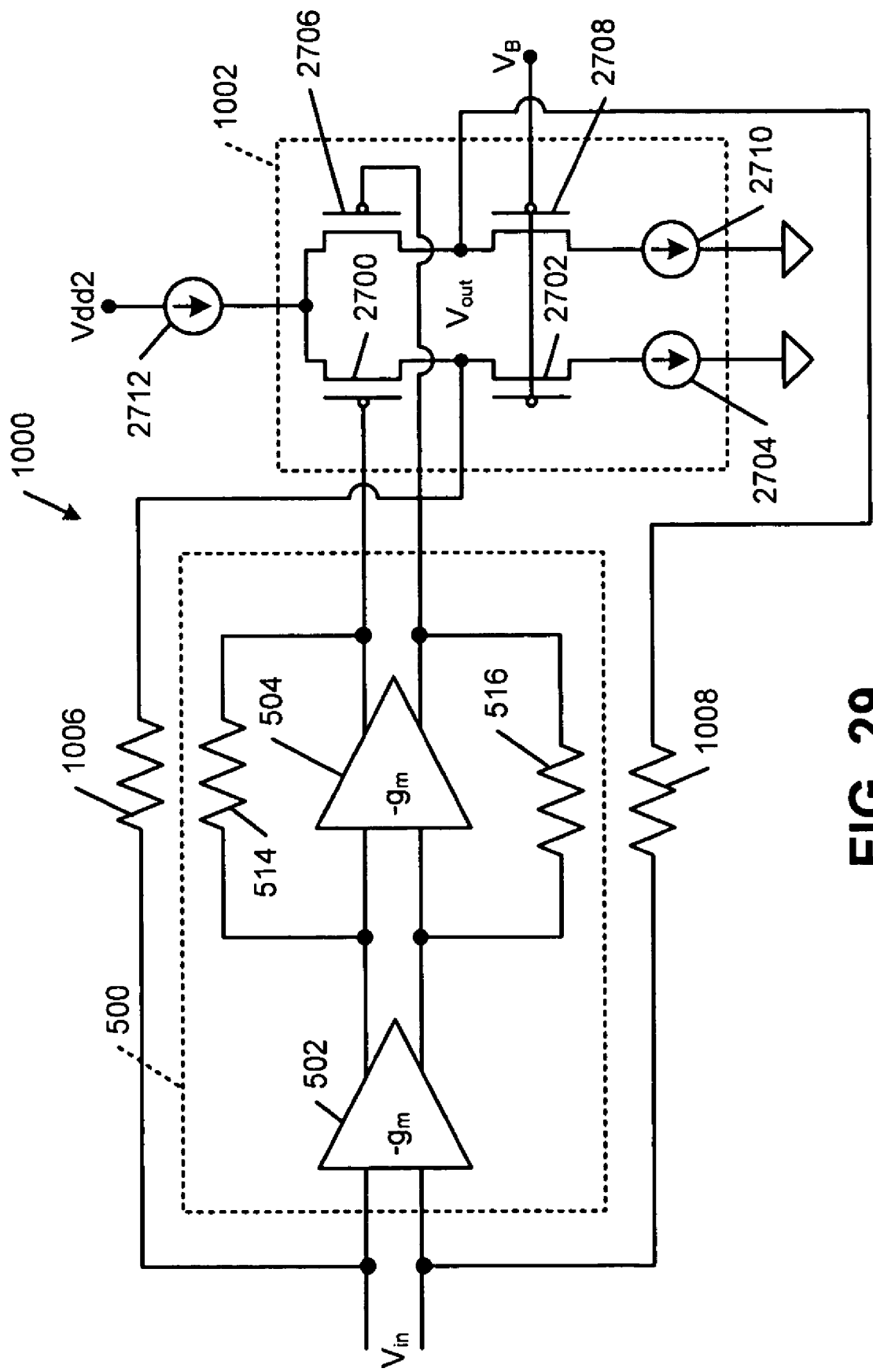
FIG. 29 illustrates the differential first-order nested TIA of FIG. 27 including an differential opamp of the second configuration.

Referring now to FIG. 29, the differential mode first-order nested TIA 1000 of FIG. 27 is shown including a second implementation of opamp 1002. The second implementation includes a third current source 2712 that provides current to the drains of first transistor 2700 and third transistor 2706. The third current source 2712 draws current from $V_{dd2}$.

Figure 30:
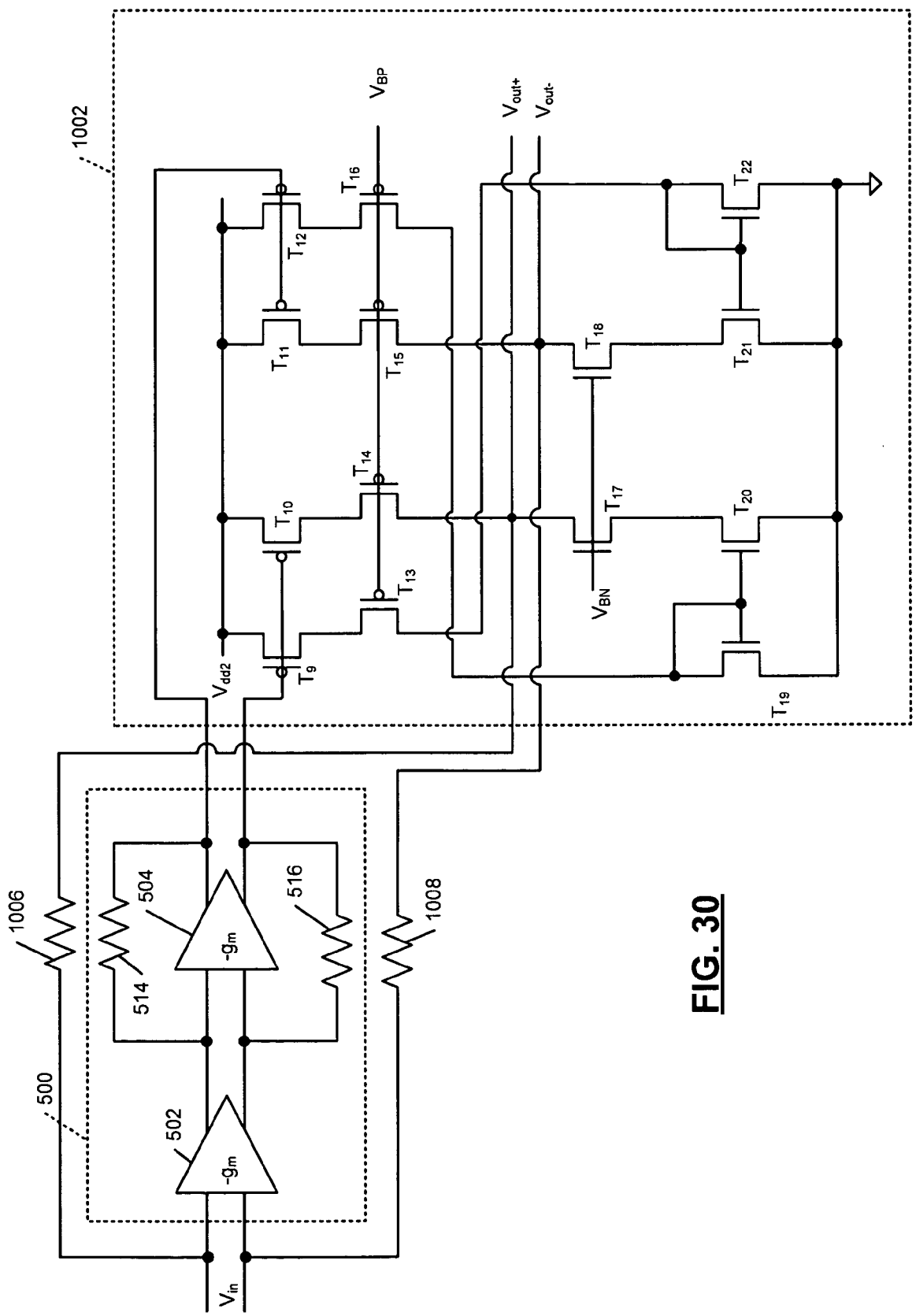
FIG. 30 illustrates the differential first-order nested TIA of FIG. 10 including a differential opamp in a push-pull configuration.

Referring now to FIG. 30, the differential mode first-order nested TIA 1000 of FIG. 10 is shown including a third implementation of opamp 1002. Opamp 1002 includes a push-pull configuration as shown. The opamp 1002 receives a positive bias voltage $V_{BP}$ and a negative bias voltage $V_{BN}$. The differential output signal is taken across nodes $V_{out+}$ and $V_{out-}$.

Figure 31:
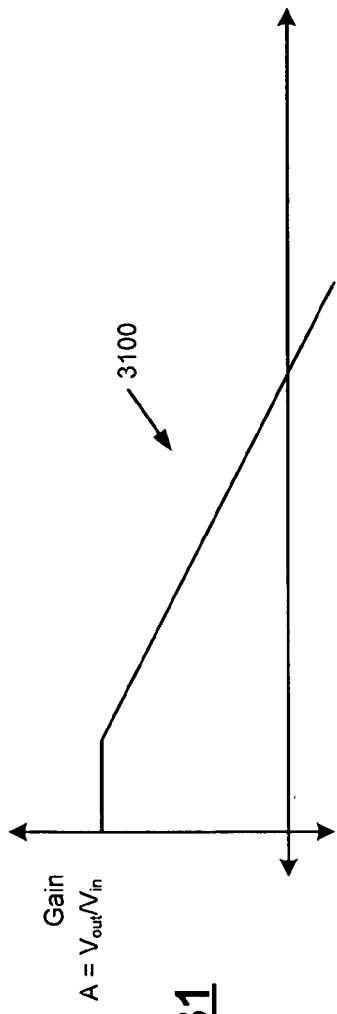
FIGS. 31-33 show a family of gain curves for first and second stages of nested TIAs.
Figure 32:
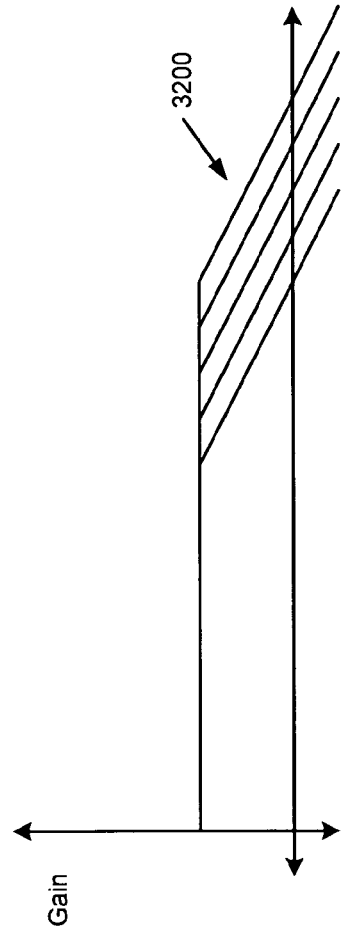
Figure 33:
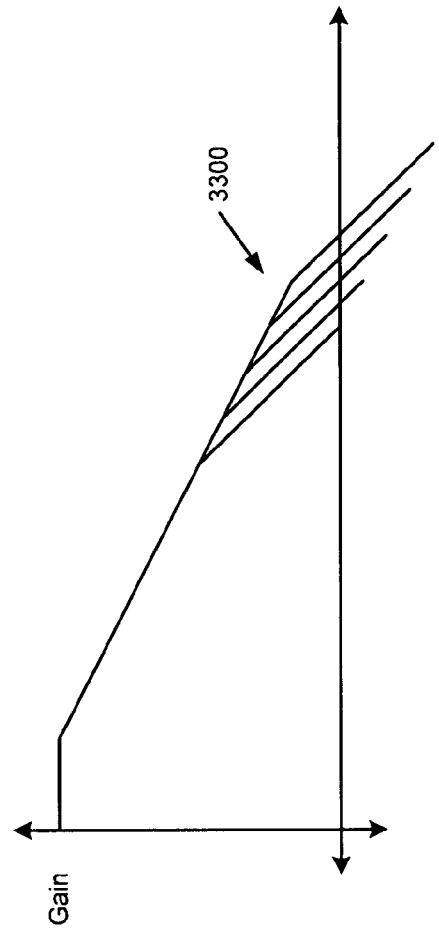

Referring now to FIGS. 31-33, a family of gain curves is shown. The gain curves represent typical gain patterns of the various first-order nested TIAs described above. A logarithmic vertical axis of each graph represents gain $A=V_{out}/V_{in}$. A logarithmic horizontal axis of each graph represents signal frequency. The graph of FIG. 31 represents a gain curve 3100 of the various opamps. The opamps provide a lower gain and higher bandwidth than the zero-order TIAs. The opamp gain rolls off at a rate of 20 dB/decade.

The graph of FIG. 32 represents a family of gain curves 3200 for various TIAs. The gain curve 3200 having the smallest bandwidth corresponds with a zero-order TIA. The gain curves 3200 with higher bandwidths correspond with increasingly-nested TIAs. The TIAs generally provide a high gain and medium bandwidth when compared to the opamps. The zero-order TIA gain rolls off at a rate of 20 dB/decade.

The graph of FIG. 33 represents a family of gain curves 3300 of the various first-order nested TIAs. The gains are relatively flat at the lowest frequencies. As the frequency increases the gains roll off at 20 dB/decade due to the gain effects of the opamp as shown in FIG. 31. As the frequency continues to increase the gains roll off at 40 dB/decade due to the combined effects of the opamp and the selected zero-order TIA.

Figure 34:
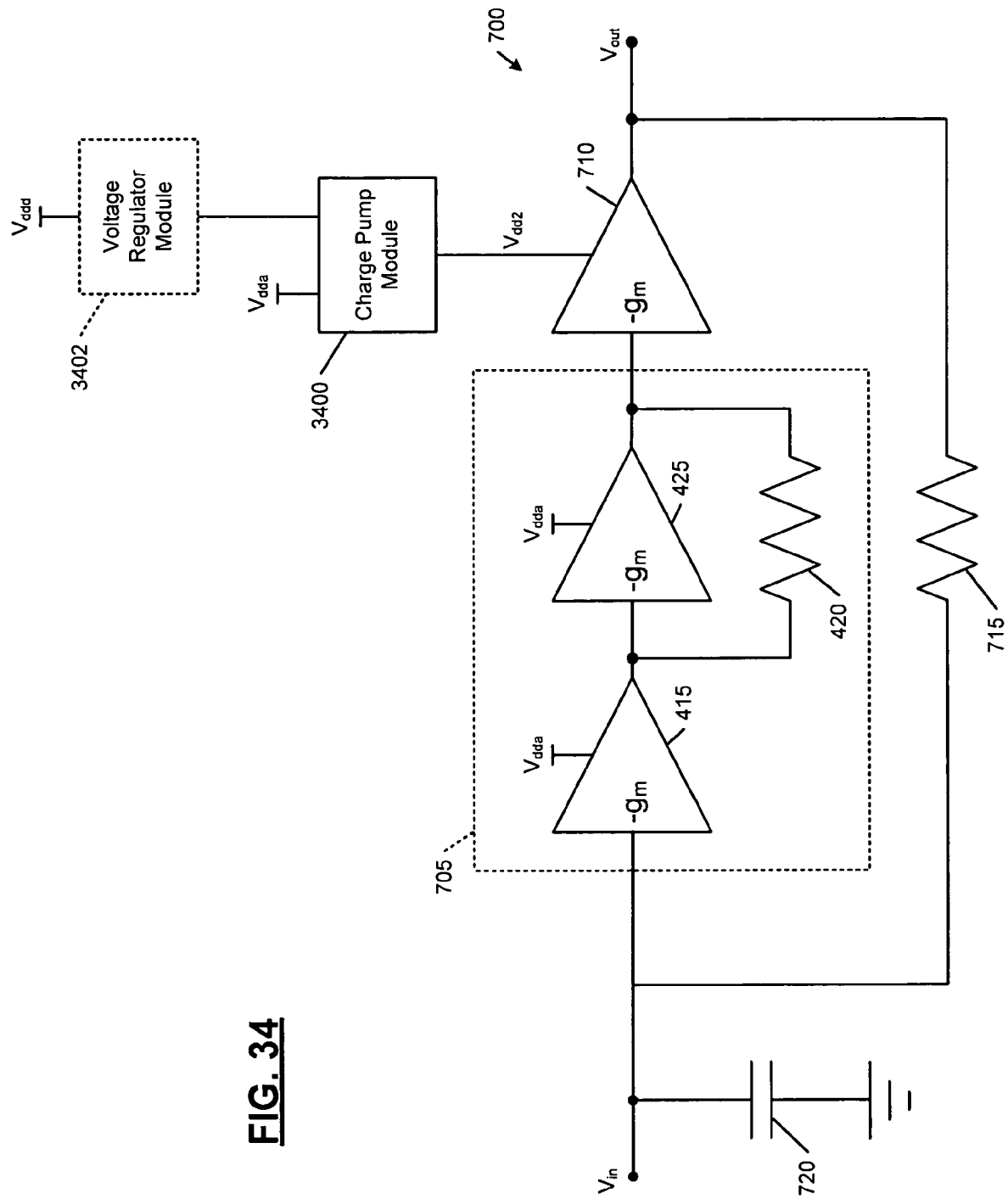
FIG. 34 shows a functional block diagram of a power supply for nested TIAs.

Referring now to FIG. 34, a functional block diagram is shown of a power supply arrangement for first-order nested TIAs. The power supply arrangement provides a TIA chip with three unique voltages levels despite providing external connections for two voltages and ground. While FIG. 34 shows the power supply connected to the first-order nested TIA 700 of FIG. 7, it is understood by those skilled in the art that the power supply may be used with other single-ended and differential first-order nested TIAs. An analog power supply $V_{dda}$ is associated with one of the external connections and provides power to the zero-order TIA. In some embodiments $V_{dda}$ is between about 2.5V and 3.3V.

The analog power supply $V_{dda}$ also provides power to a charge pump module 3400. Charge pump module 3400 also receives power from a digital power supply $V_{ddd}$. $V_{ddd}$ is associated with the second one of the external connections. Charge pump module 3400 can be fabricated on the same chip as the first-order nested TIAs. In some embodiments $V_{ddd}$ is about 1.2V. In some embodiments $V_{ddd}$ can be regulated by a voltage regulator module 3402 before being applied to the charge pump module 3400. The charge pump module 3400 generates a second digital voltage $V_{dd2}$ that is approximately equal to $V_{dda}+V_{ddd}$. Therefore $V_{dd2}>V_{dda}$. It is appreciated by those skilled in the art that $V_{dd2}$ is not exactly equal to $V_{dda}+V_{ddd}$ due to losses and/or inefficiencies inherent in the charge pump module 3400.

Figure 35:
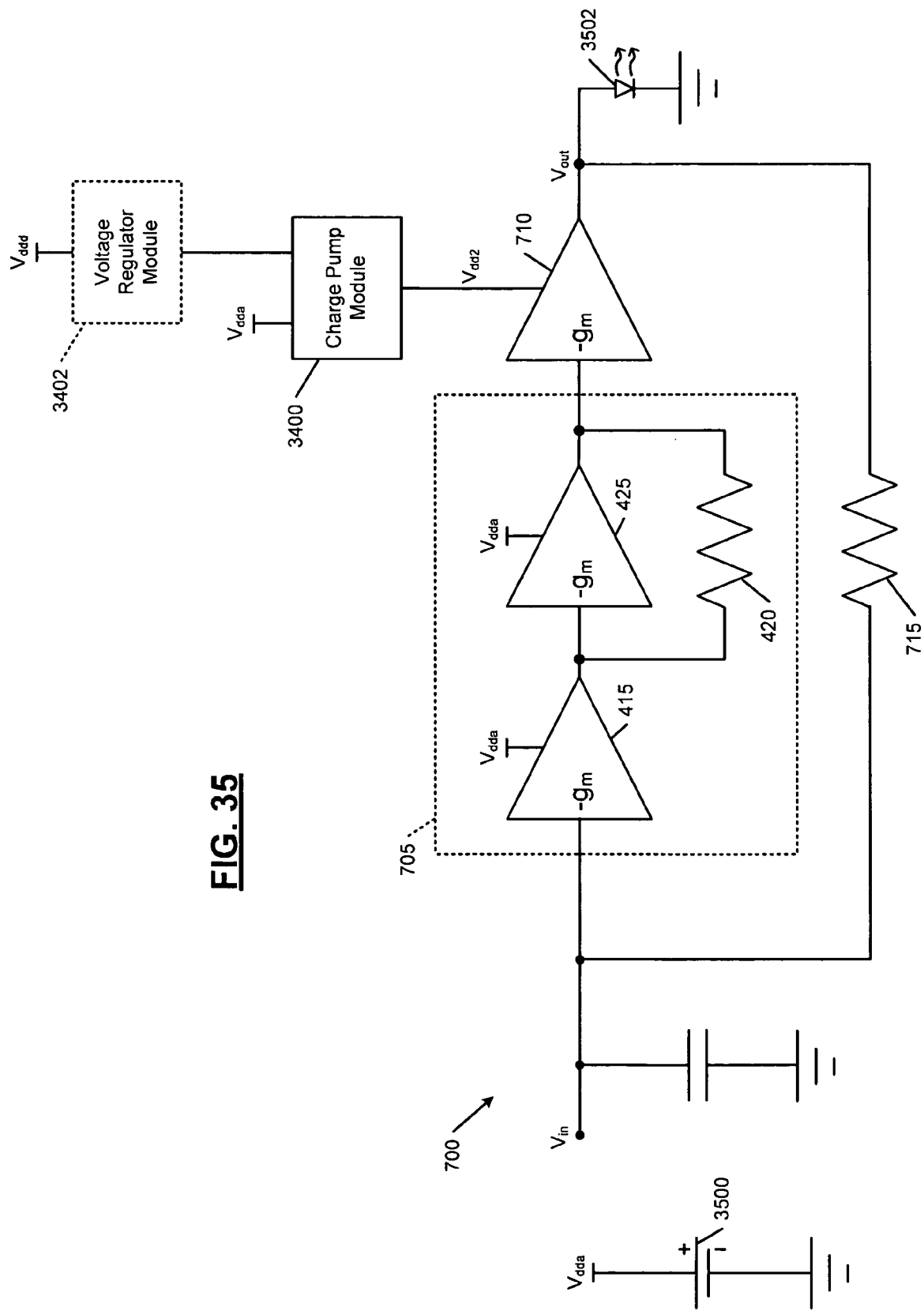
FIG. 35 illustrates and exemplary LED drive circuit using the power supply of FIG. 34.

Referring now to FIG. 35, an application of the power supply of FIG. 35 is shown. $V_{dda}$ is provided by a battery 3500. Battery 3500 can be a lithium-ion battery having a voltage between about 2.7V and 4.2V. A light-emitting diode (LED) communicates with an output of the opamp 710. In some embodiments the LED has a turn-on voltage $V_D$ of about 3.5V. The charge pump module 3400 adds $V_{dda}$ from the battery 3500 to $V_{ddd}$ to generate sufficient voltage for driving the LED 3502. Since $V_{ddd}$ generally provides only about 1.2V it can not be used alone to power the LED 3502. The charge pump module 3400 provides the additional voltage from $V_{dda}$ to supply the LED with approximately 3.7V to 4.2V, which is above the 3.5V $V_D$. The range of 3.7V to 4.2V accounts for the losses and/or inefficiencies in the charge pump module 3400 and is therefore not exactly equal to $V_{dda}+V_{ddd}$.

The present disclosure also addresses the need for increasing the gain-bandwidth product of TIAs. Improvements in the gain-bandwidth product may be achievable by "nesting" a TIA within another TIA. In other words, additional circuit elements such as feedback resistances, capacitances and/or opamps are added on the input and/or output sides of the TIA.

Figure 36:
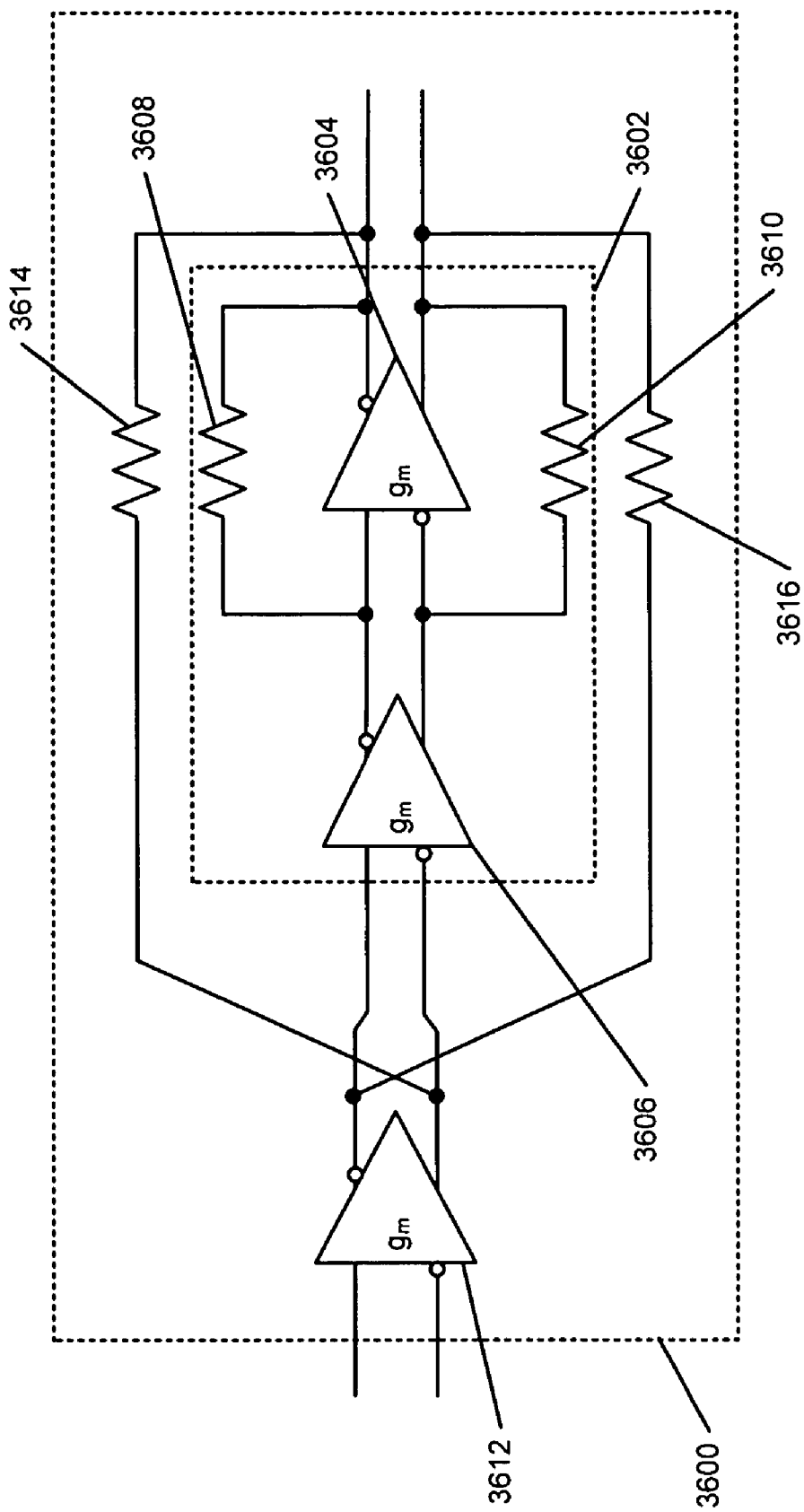
FIG. 36 is a simplified schematic view of a differential single-nested transimpedance amplifier according to one aspect of the disclosure.

Referring now to FIG. 36, a nested transimpedance amplifier (TIA) circuit 3600 having an inner TIA 3602 is illustrated. The transimpedance amplifier 3602 includes a first operational amplifier 3604 and a second operational amplifier 3606. Each operational amplifier set forth in this figure and the following figures has a non-inverting input and non-inverting output identified by the absence of the "o" symbol, and an inverting input and inverting output identified by the "o" symbol. The transimpedance amplifier 3602 also includes a first feedback resistance 3608 that communicates with the non-inverting input and the inverting output, and a second resistance 3610 that communicates with the inverting input and the non-inverting output.

The nested transimpedance amplifier 3600 also includes a third operational amplifier 3612 also having an inverting input and output, and a non-inverting input and output. The operational amplifier 3612 has an inverting output that communicates with the non-inverting input of amplifier 3606, and a non-inverting output that communicates with the inverting input of amplifier 3606.

A feedback resistance 3614 communicates with the non-inverting output of amplifier 3612 and the inverting output of amplifier 3604. The inverting output of amplifier 3612 communicates with the non-inverting output of amplifier 3604. That is, resistance 3614 communicates with the inverting input of amplifier 3606, while resistance 3616 communicates with the non-inverting input of amplifier 3606.

Figure 37:
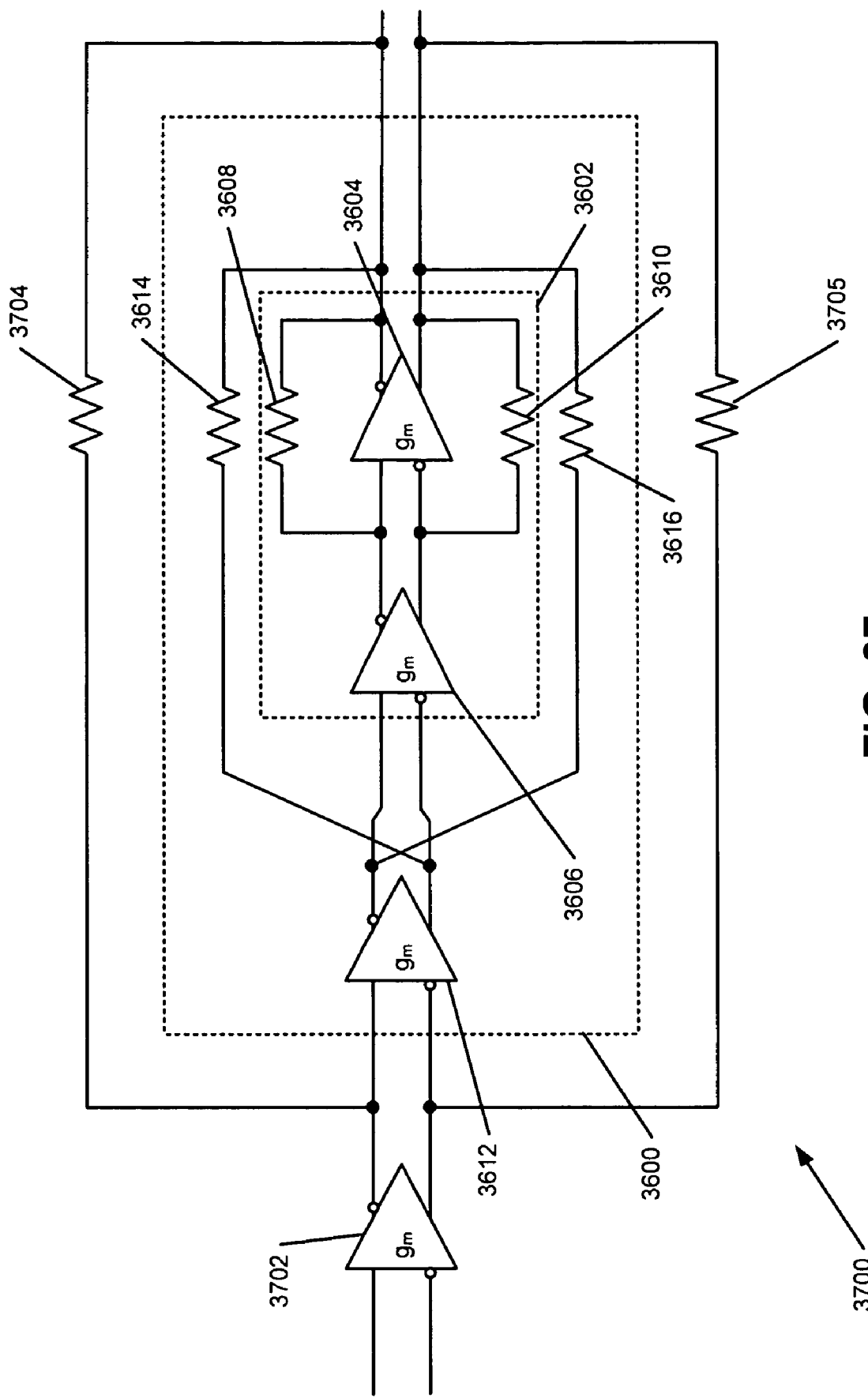
FIG. 37 is a simplified schematic view of a differential double-nested transimpedance amplifier according to a second embodiment of the disclosure.

Referring now to FIG. 37, a double-nested transimpedance amplifier 3700 is illustrated. The double-nested transimpedance amplifier includes the transimpedance amplifier 3602 and the nested transimpedance amplifier structure 3600 of FIG. 36. Therefore, these common circuit components will not be described further. In this embodiment, another amplifier 3702 also having inverting and non-inverting inputs and outputs is illustrated. In this embodiment, the inverting output of amplifier 3702 communicates with the non-inverting input of amplifier 3612. The non-inverting output of amplifier 3702 communicates with the inverting input of amplifier 3612. A feedback resistance 3704 communicates with the common node of the inverting output of amplifier 3702 and the non-inverting input of amplifier 3612. The resistance 3704 is also communicates with the inverting output of amplifier 3604. A second feedback resistance 3705 communicates with the common node between the non-inverting output of amplifier 3702 and the inverting input of amplifier 3612, and the non-inverting output of amplifier 3604.

By providing the differentials and feedback structures illustrated in FIGS. 36 and 37, fewer inversions for a given level of nesting are set forth. The result is a potentially higher frequency operation from a device such as that illustrated in FIG. 7. In these examples, the nesting occurs at the output node causing the output distortion to be improved as the level of nesting increases.

Figure 38:
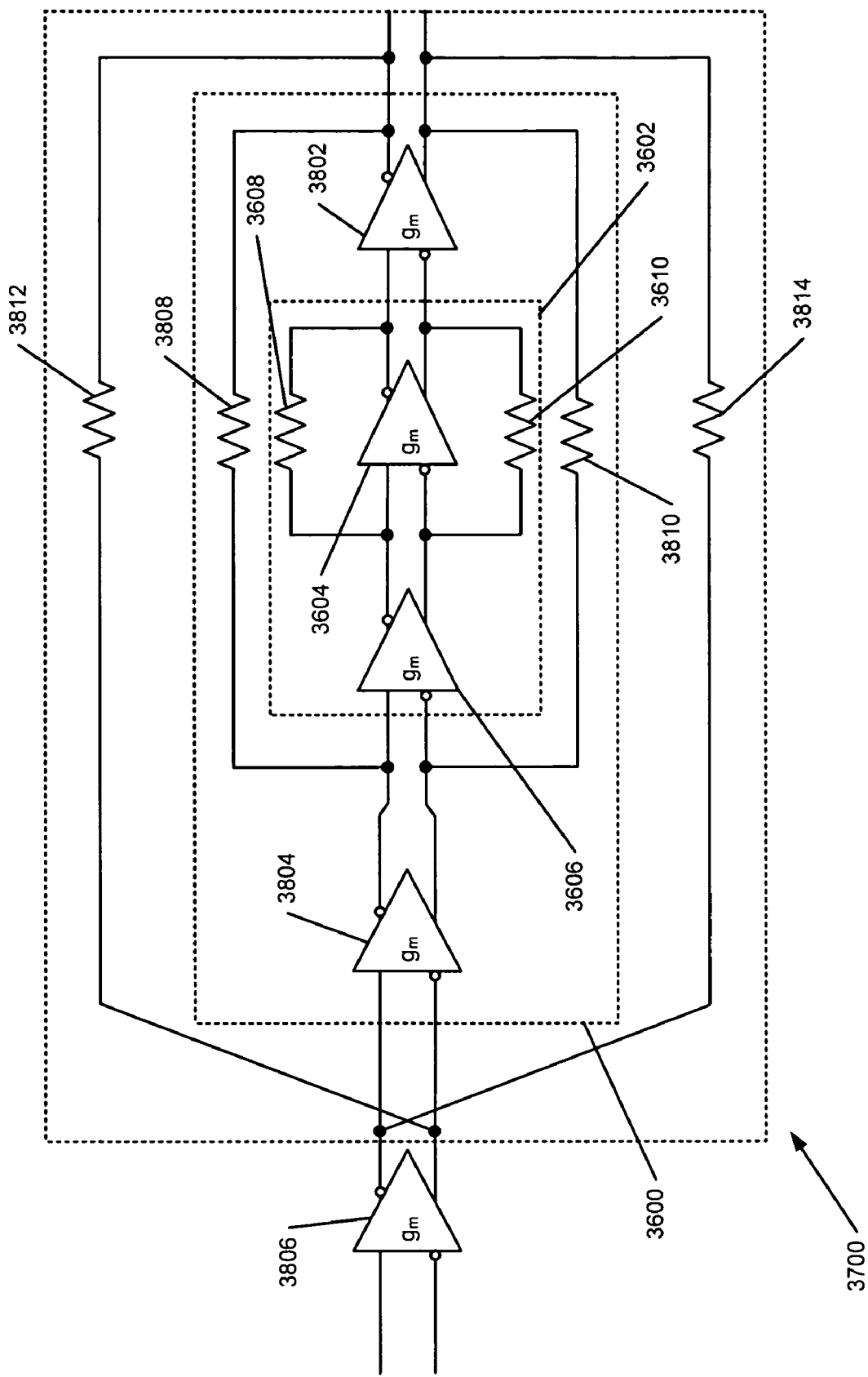
FIG. 38 is a simplified schematic view of a differential amplifier nested according to a third embodiment of the disclosure.

Referring now to FIG. 38, a transimpedance structure 3602 illustrated in FIG. 36 is used in a nested TIA 3800. In this embodiment, an operational amplifier 3802 has its inverting input communicates with the non-inverting output of amplifier 3604. The non-inverting input of amplifier 3802 communicates with the inverting output of amplifier 3604.

Another amplifier 3804 has an inverting output that communicates with the non-inverting input of amplifier 3606. The non-inverting output of amplifier 3804 communicates with the inverting input of amplifier 3606. Another operational amplifier 3806 has an inverting output that communicates with the non-inverting input of amplifier 3804 and a non-inverting output that communicates with the inverting input of amplifier 3804. A first feedback resistance 3808 communicates with the common node between the inverting output of amplifier 3804 and the non-inverting input of amplifier 3606, and the inverting output of amplifier 3802. Another feedback resistance 3810 communicates with the common node of the non-inverting output of amplifier 3804 and the inverting input of amplifier 3606, and the non-inverting output of amplifier 3802.

A feedback resistance 3812 communicates with the common node between the non-inverting output of amplifier 3806 and the inverting amplifier 3804, and the inverting output of amplifier 3802. Another resistance 3814 communicates with the node between inverting output of amplifier 3806 and the non-inverting input of amplifier 3804, and the non-inverting output of 3802.

Different types of nesting may be performed to build a higher order nested transimpedance amplifier. The amplifier 3802 is not important as far as nesting is concerned. If the input of the circuit is current instead of voltage, amplifier 3806 may not be required.

Figure 39A:
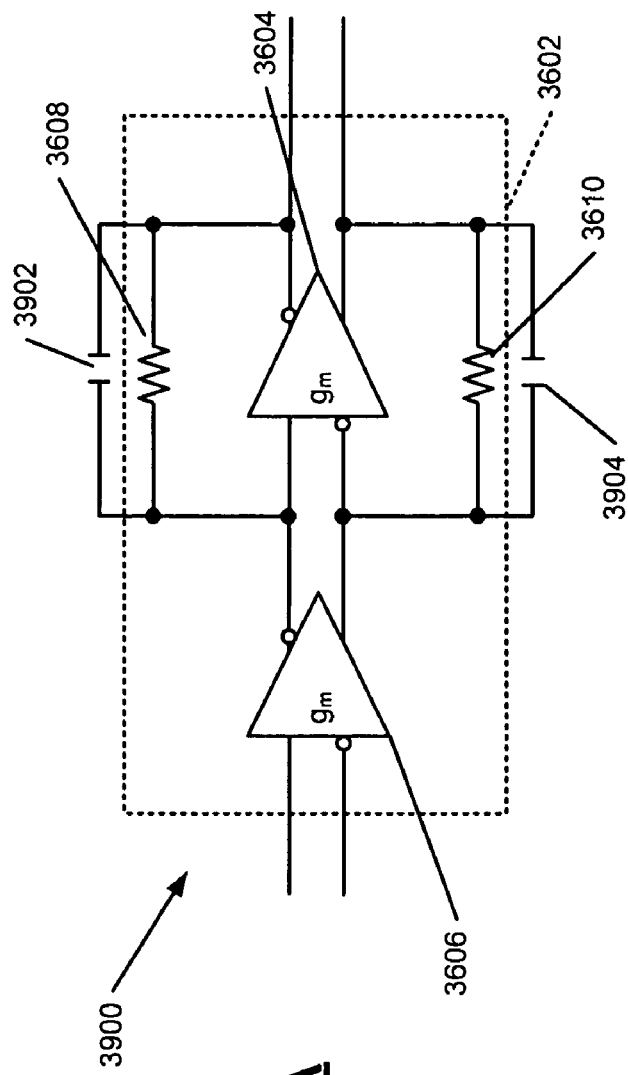
FIGS. 39A and 39B are schematic views of differential and single-ended transimpedance amplifiers, respectively, having a compensation capacitor in a feedback loop.
Figure 39B:
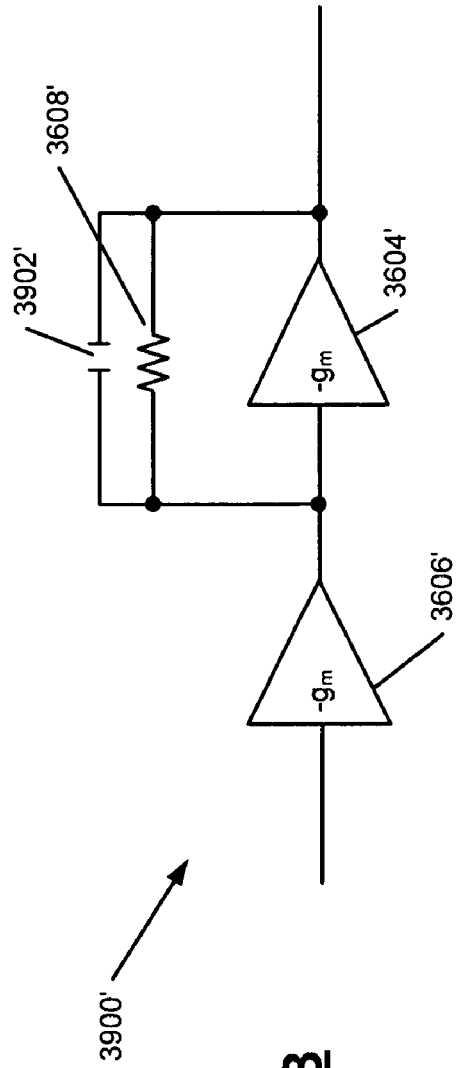

Referring now to FIGS. 39A and 39B, differential and single-ended transimpedance amplifiers having capacitive feedback are shown, respectively. In FIG. 39A, a differential transimpedance amplifier 3900, which is similar to the transimpedance amplifier 3602 of FIG. 36, is illustrated having a first capacitance 3902 in parallel with resistance 3608 and a second capacitance 3904 in parallel with resistance 3610. In this embodiment, the frequency response or the stability of the transimpedance network may be improved by including the capacitances 3902 and 3904. As can be appreciated, the capacitances can be replaced by inductances if desired.

In FIG. 39B, a single-ended transimpedance amplifier 3900' is shown that is similar to the differential configuration shown in FIG. 39A. In FIG. 39B, similar elements are labeled with a prime symbol "'". The transconductance $g_m$ of the amplifiers 3604' and/or 3606' may be negative and/or the signals may be coupled to inverting input(s) of the amplifiers 3604' and/or 3606'.

Figure 40A:
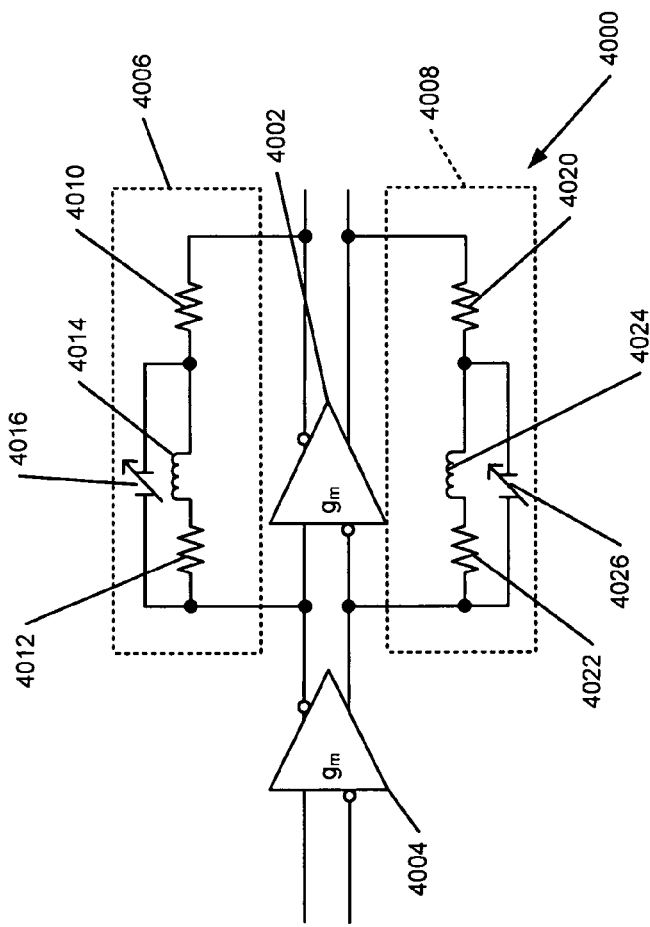
FIGS. 40A and 40B are schematic views of differential and single-ended nested transimpedance amplifiers, respectively, having an LC tank circuit.
Figure 40B:
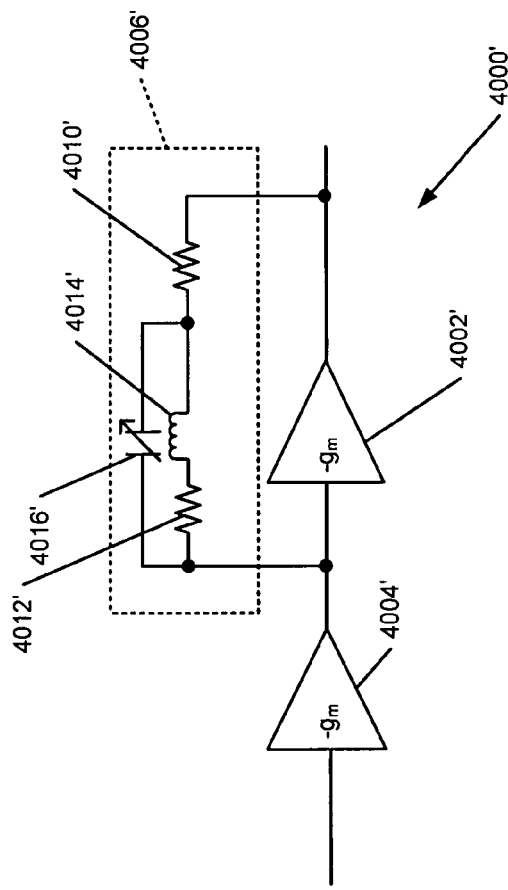

Referring now to FIGS. 40A and 40B, an LC tank circuit is included in the feedback of differential and single-ended transimpedance amplifiers, respectively. In FIG. 40A, a differential transimpedance amplifier 4000 is shown. In this embodiment, a first operational amplifier 4002 has a non-inverting input communicates with an inverting output of amplifier 4004. The inverting input of amplifier 4002 communicates with the non-inverting output of amplifier 4004. A feedback element 4006 communicates with the common node of the non-inverting input of amplifier 4002 and the inverting output of amplifier 4004, and the inverting output of amplifier 4002. Likewise, a second feedback element 4008 communicates with the common node of the inverting input of amplifier 4002 and the non-inverting output of amplifier 4004, and the non-inverting output of amplifier 4002.

The feedback element 4006 includes a resistance 4010, a series combination of a resistance 4012, and an inductance 4014. In some implementations, the inductance 4014 can be a variable inductance. A variable capacitance 4016 is coupled in parallel with the series combination of the resistance 4012 and the inductance 4014. This parallel combination is coupled in series with the resistance 4010. Likewise, the feedback element 4008 is configured in a similar way with a resistance 4020, a second resistance 4022 in series with an inductance 4024, and a variable capacitance 4026.

The variable capacitances 4016 and 4026 are used to illustrate that various resonant frequencies of the LC tank circuit may be adjusted by changing the capacitance values. In an actual embodiment, a fixed capacitance set to the desired residence frequency may be used. The circuit 4000 may be suitable for use as an RF amplifier in a TV tuner in which it is desirable to include an ultra-wide band of operation (e.g., 50 MHz-1 GHz). The circuit amplifies the wanted signal more than the unwanted signal by taking advantage of the LC tank in combination with the transimpedance amplifier property of the wide-band operation. The parallel LC tank circuit causes the feedback network to have high impedance at a resonance frequency of the LC tank circuit.

The structure illustrated in FIG. 40 may also be nested in an amplifier structure illustrated above. With each subsequent nesting, only the signal frequency of interest is amplified so that the nesting behavior is effective at the residence frequency of the LC tank elements. Because of this, the selectivity of the nested LC tank circuit transimpedance amplifier is significantly improved while the out-of-band signals are not amplified. This improves the distortion performance of the amplifier by not amplifying the unwanted signals. At the same time, in-band signals are amplified with extremely low distortion because of the nature of the nesting transimpedance amplifier.

In FIG. 40B, a single-ended transimpedance amplifier 4000' is shown that is similar to the differential configuration shown in FIG. 40A. In FIG. 40B, similar elements are labeled with a prime symbol "'". The transconductance $g_m$ of the amplifiers 4002' and/or 4004' may be negative and/or the signals may be coupled to inverting input(s) of the amplifiers 4002' and/or 4004'.

Figure 41A:
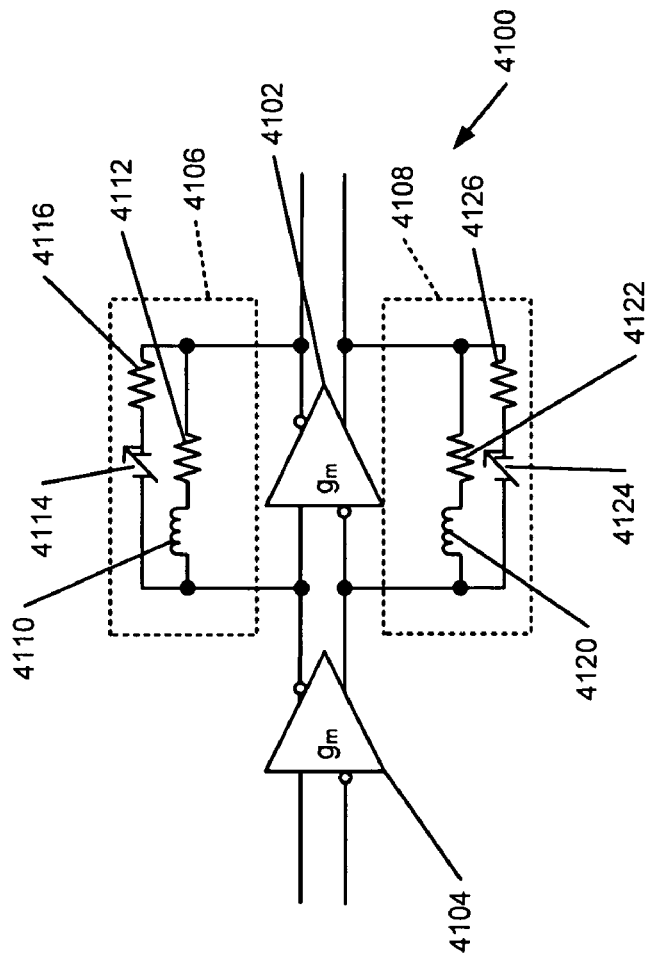
FIGS. 41 and 41B are schematic views of differential and single-ended transimpedance amplifiers, respectively, having an LC tank circuit and resistors in the feedback loops according to the present disclosure.
Figure 41B:
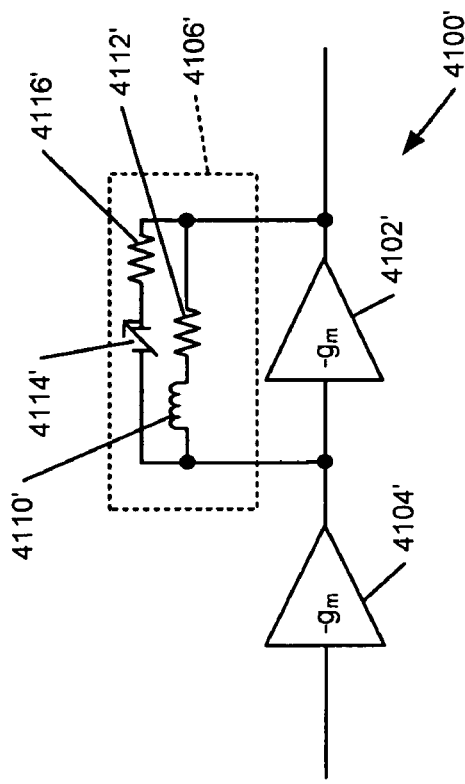

Referring now to FIGS. 41A and 41B, a schematic view of another embodiment of differential and single-ended transimpedance amplifiers are shown, respectively. In FIG. 41A, a differential transimpedance amplifier 4100 using an LC circuit is illustrated. In this embodiment, a first operational amplifier 4102 communicates with a second amplifier 4104. An inverting output of amplifier 4104 communicates with a non-inverting input of amplifier 4102. A non-inverting output of amplifier 4104 communicates with an inverting input of amplifier 4102. A first LC circuit 4106 communicates with the non-inverting input of amplifier 4102 and the inverting output of amplifier 4102. A second LC circuit 4108 communicates with the inverting input and the non-inverting output of amplifier 4102.

LC circuit 4106 includes an inductance 4110 in series with a resistance 4112. The LC circuit 4106 also includes a capacitance 4114 in series with a resistance 4116. The series combination of the capacitance 4114 and resistance 4116 is in parallel with the series combination of the inductance 4110 and the resistance 4112.

The LC circuit 4108 is configured in a similar manner to LC circuit 4106. The LC circuit 4108 includes an inductance 4120 in series with a resistance 4122. A capacitance 4124 is in series with a resistance 4126. The series combination of the inductance 4120 and resistance 4122 is in parallel with the series combination of the capacitance 4124 and the resistance 4126.

By providing a resistance in parallel with the LC tank circuit, as illustrated in FIG. 40, or adding a resistance to both the inductance and capacitance, oscillations of the circuit are avoided. The extra resistance, as compared to FIG. 40, prevents the polarity of the amplifier from changing at high frequencies. This is used to prevent feedback operation within the nested transimpedance structure.

In FIG. 41B, a single-ended transimpedance amplifier 4100' is shown that is similar to the differential configuration shown in FIG. 41A. In FIG. 41B, similar elements are labeled with a prime symbol "'". The transconductance $g_m$ of the amplifiers 4102' and/or 4104' may be negative and/or the signals may be coupled to inverting input(s) of the amplifiers 4102' and/or 4104'.

Figure 42:
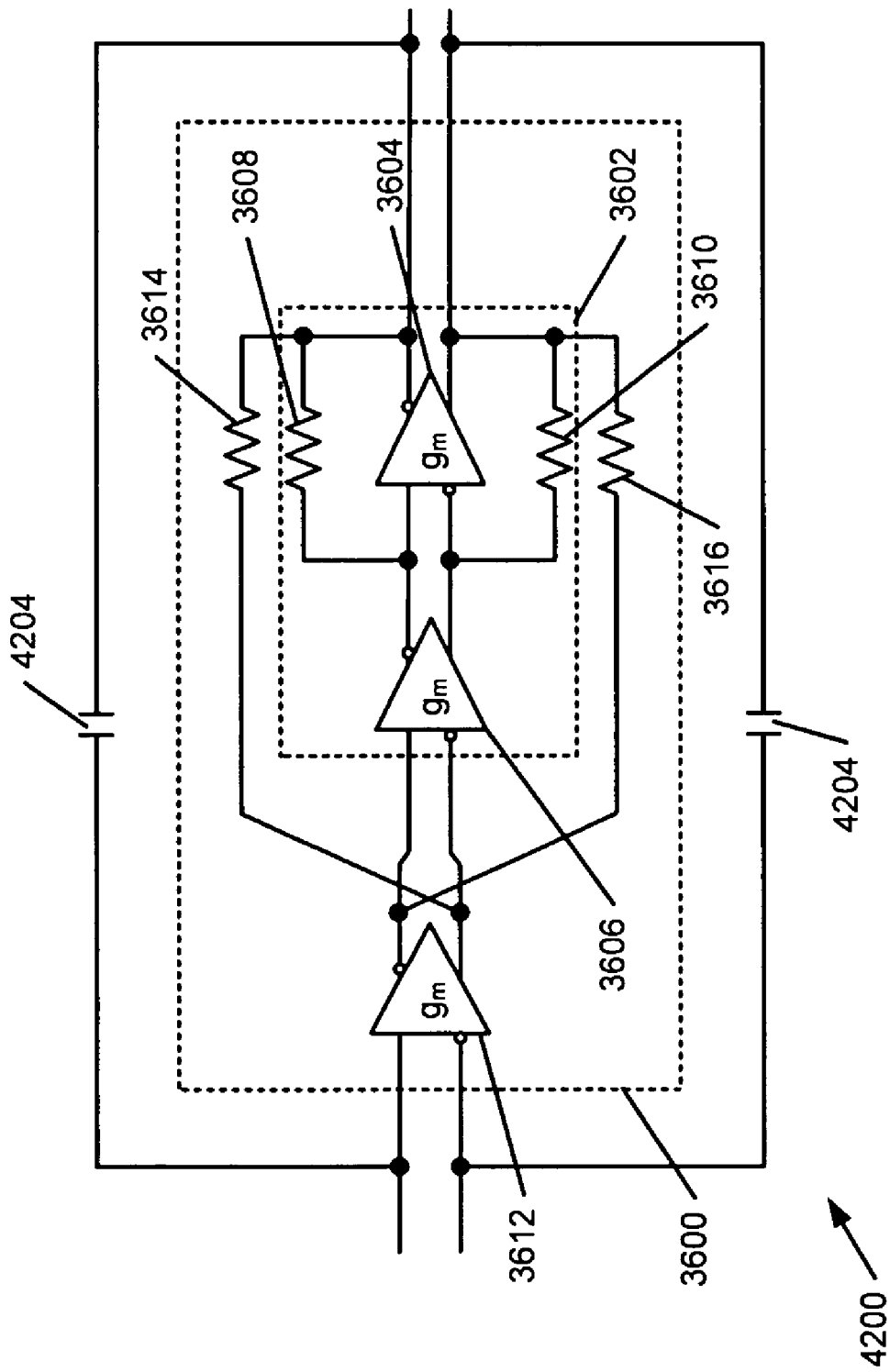
FIG. 42 is a schematic view of an alternative embodiment of a transimpedance amplifier having an LC tank circuit.

Referring now to FIG. 42, an integrator 4200 that is formed using a nested transimpedance amplifier is illustrated. This embodiment is identical to the double-nested transimpedance amplifier illustrated in FIG. 37, except that resistances 3704 and 3705 have been replaced with capacitances 4202 and 4204.

The integrator 4200 has a high bandwidth due to the transimpedance configuration. The impedance output is low even at high frequencies. Because of the low output impedance, the integrator 4200 may be useful to drive large capacitive loads.

One application of the integrator 4200 may be in a Sigma-Delta analog-to-digital converter that operates at gigahertz over sampling frequencies.

Figure 43B:
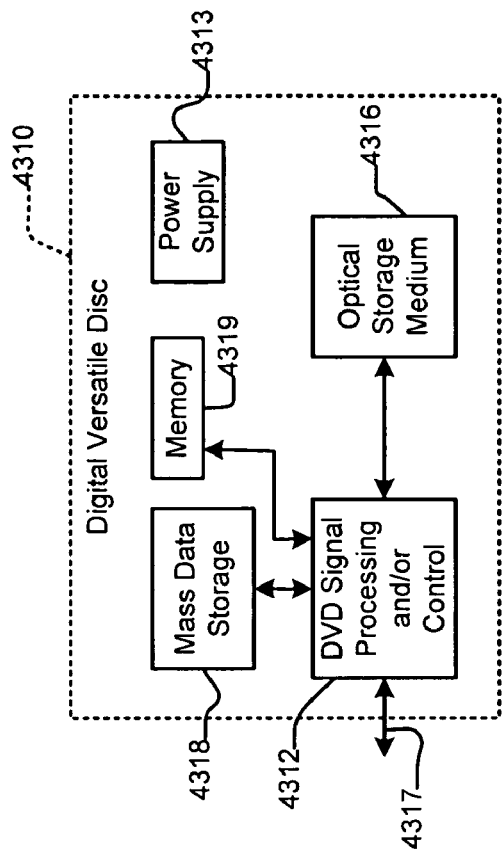
FIG. 43B is a functional block diagram of a digital versatile disk (DVD)
Figure 43A:
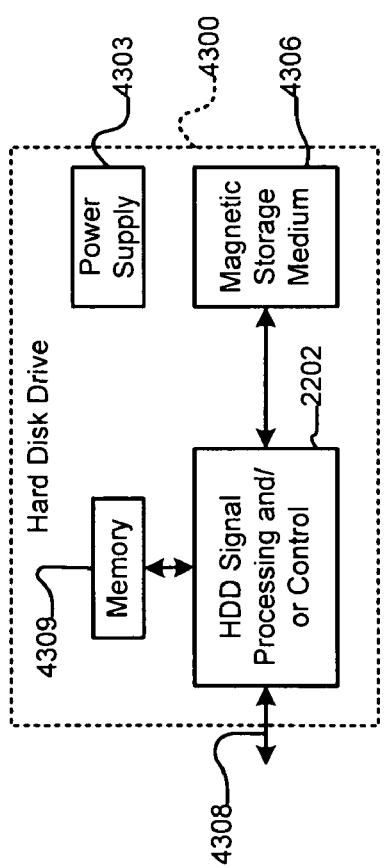
FIG. 43A is a functional block diagram of a hard disk drive.

Referring now to FIGS. 43A-43G, various exemplary implementations of the present disclosure are shown. Referring now to FIG. 43A, the present disclosure can be implemented in amplifiers and/or integrators of a hard disk drive 4300. The present disclosure may implement and/or be implemented in either or both signal processing and/or control circuits and/or a power supply 4303, which are generally identified in FIG. 43A at 4302. In some implementations, the signal processing and/or control circuit 4302 and/or other circuits (not shown) in the HDD 4300 may process data, perform coding and/or encryption, perform calculations, and/or format data that is output to and/or received from a magnetic storage medium 4306.

The HDD 4300 may communicate with a host device (not shown) such as a computer, mobile computing devices such as personal digital assistants, cellular phones, media or MP3 players and the like, and/or other devices via one or more wired or wireless communication links 4308. The HDD 4300 may be connected to memory 4309 such as random access memory (RAM), low latency nonvolatile memory such as flash memory, read only memory (ROM) and/or other suitable electronic data storage.

Referring now to FIG. 43B, the present disclosure can be implemented in amplifiers and/or integrators of a digital versatile disc (DVD) drive 4310. The present disclosure may implement and/or be implemented in either or both signal processing and/or control circuits, which are generally identified in FIG. 43B at 4312, mass data storage of the DVD drive 4310 and/or a power supply 4313. The signal processing and/or control circuit 4312 and/or other circuits (not shown) in the DVD 4310 may process data, perform coding and/or encryption, perform calculations, and/or format data that is read from and/or data written to an optical storage medium 4316. In some implementations, the signal processing and/or control circuit 4312 and/or other circuits (not shown) in the DVD 4310 can also perform other functions such as encoding and/or decoding and/or any other signal processing functions associated with a DVD drive.

The DVD drive 4310 may communicate with an output device (not shown) such as a computer, television or other device via one or more wired or wireless communication links 4317. The DVD 4310 may communicate with mass data storage 4318 that stores data in a nonvolatile manner. The mass data storage 4318 may include a hard disk drive (HDD). The HDD may have the configuration shown in FIG. 43A. The HDD may be a mini HDD that includes one or more platters having a diameter that is smaller than approximately 1.8". The DVD 4310 may be connected to memory 4319 such as RAM, ROM, low latency nonvolatile memory such as flash memory and/or other suitable electronic data storage.

Figure 43D:
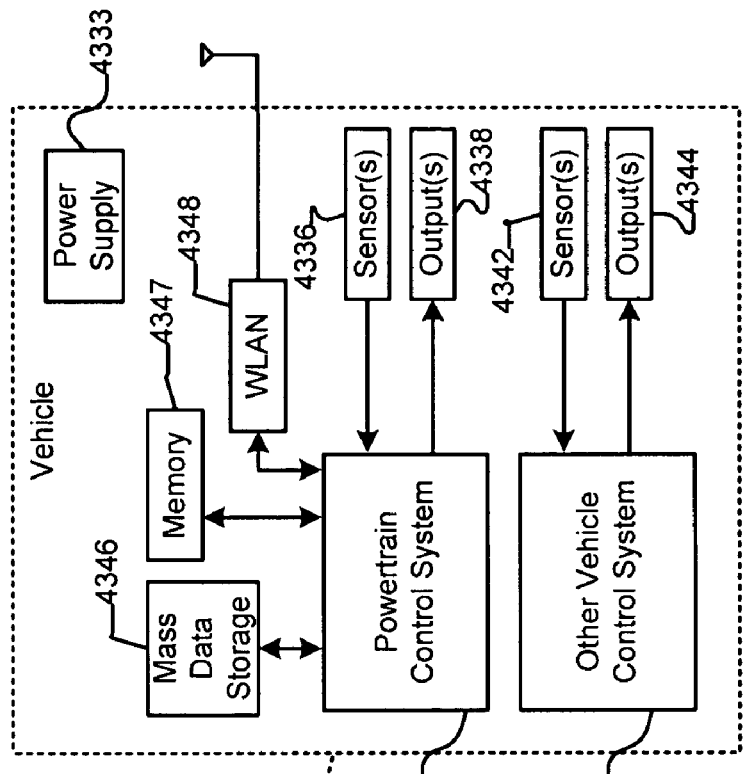
FIG. 43D is a functional block diagram of a vehicle control system.
Figure 43C:
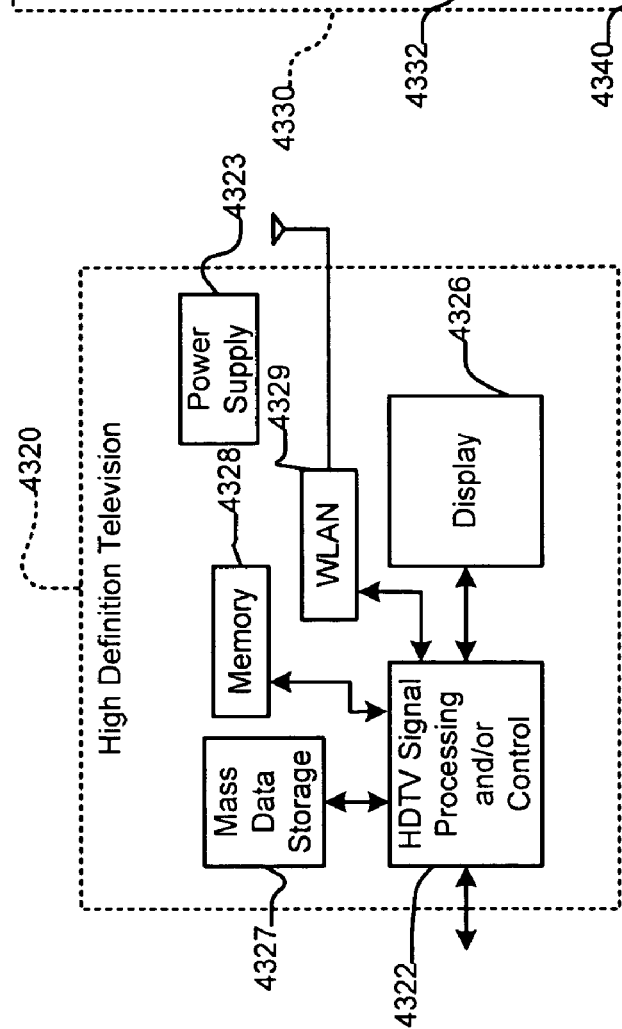
FIG. 43C is a functional block diagram of a high definition television.

Referring now to FIG. 43C, the present disclosure can be implemented in amplifiers and/or integrators of a high definition television (HDTV) 4320. The present disclosure may implement and/or be implemented in either or both signal processing and/or control circuits, which are generally identified in FIG. 43E at 4322, a WLAN interface, mass data storage of the HDTV 4320 and/or a power supply 4323. The HDTV 4320 receives HDTV input signals in either a wired or wireless format and generates HDTV output signals for a display 4326. In some implementations, signal processing circuit and/or control circuit 4322 and/or other circuits (not shown) of the HDTV 4320 may process data, perform coding and/or encryption, perform calculations, format data and/or perform any other type of HDTV processing that may be required.

The HDTV 4320 may communicate with mass data storage 4327 that stores data in a nonvolatile manner such as optical and/or magnetic storage devices. At least one HDD may have the configuration shown in FIG. 43A and/or at least one DVD may have the configuration shown in FIG. 43B. The HDD may be a mini HDD that includes one or more platters having a diameter that is smaller than approximately 1.8". The HDTV 4320 may be connected to memory 4328 such as RAM, ROM, low latency nonvolatile memory such as flash memory and/or other suitable electronic data storage. The HDTV 4320 also may support connections with a WLAN via a WLAN network interface 4329.

Referring now to FIG. 43D, the present disclosure may implement and/or be implemented in amplifiers and/or integrators of a control system of a vehicle 4330, a WLAN interface, mass data storage of the vehicle control system and/or a power supply 4333. In some implementations, the present disclosure implement a powertrain control system 4332 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present disclosure may also be implemented in other control systems 4340 of the vehicle 4330. The control system 4340 may likewise receive signals from input sensors 4342 and/or output control signals to one or more output devices 4344. In some implementations, the control system 4340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 4332 may communicate with mass data storage 4346 that stores data in a nonvolatile manner. The mass data storage 4346 may include optical and/or magnetic storage devices for example hard disk drives HDD and/or DVDs. At least one HDD may have the configuration shown in FIG. 43A and/or at least one DVD may have the configuration shown in FIG. 43B. The HDD may be a mini HDD that includes one or more platters having a diameter that is smaller than approximately 1.8". The powertrain control system 4332 may be connected to memory 4347 such as RAM, ROM, low latency nonvolatile memory such as flash memory and/or other suitable electronic data storage. The powertrain control system 4332 also may support connections with a WLAN via a WLAN network interface 4348. The control system 4340 may also include mass data storage, memory and/or a WLAN interface (all not shown).

Figure 43E:
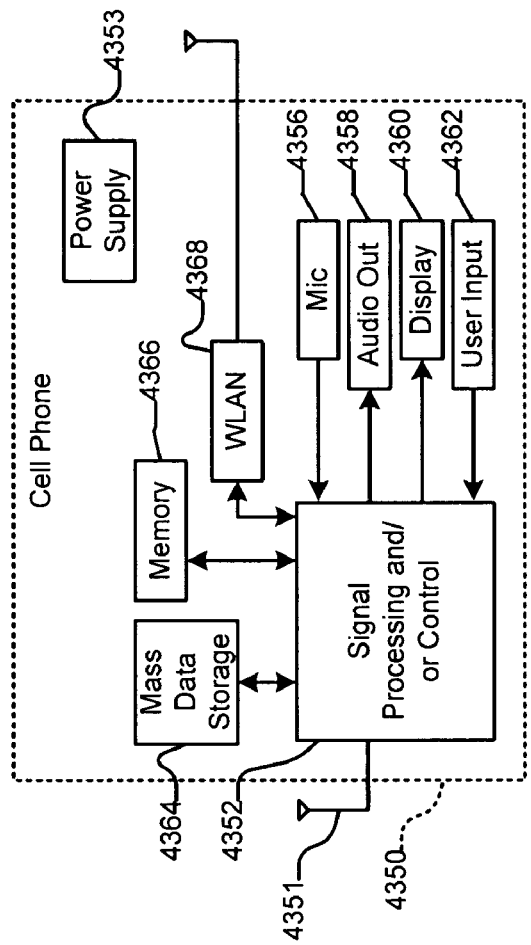
FIG. 43E is a functional block diagram of a cellular phone.

Referring now to FIG. 43E, the present disclosure can be implemented in amplifiers and/or integrators of a cellular phone 4350 that may include a cellular antenna 4351. The present disclosure may implement and/or be implemented in either or both signal processing and/or control circuits, which are generally identified in FIG. 43E at 4352, a WLAN interface, mass data storage of the cellular phone 4350 and/or a power supply 4353. In some implementations, the cellular phone 4350 includes a microphone 4356, an audio output 4358 such as a speaker and/or audio output jack, a display 4360 and/or an input device 4362 such as a keypad, pointing device, voice actuation and/or other input device. The signal processing and/or control circuits 4352 and/or other circuits (not shown) in the cellular phone 4350 may process data, perform coding and/or encryption, perform calculations, format data and/or perform other cellular phone functions.

The cellular phone 4350 may communicate with mass data storage 4364 that stores data in a nonvolatile manner such as optical and/or magnetic storage devices for example hard disk drives HDD and/or DVDs. At least one HDD may have the configuration shown in FIG. 43A and/or at least one DVD may have the configuration shown in FIG. 43B. The HDD may be a mini HDD that includes one or more platters having a diameter that is smaller than approximately 1.8". The cellular phone 4350 may be connected to memory 4366 such as RAM, ROM, low latency nonvolatile memory such as flash memory and/or other suitable electronic data storage. The cellular phone 4350 also may support connections with a WLAN via a WLAN network interface 4368.

Figure 43F:
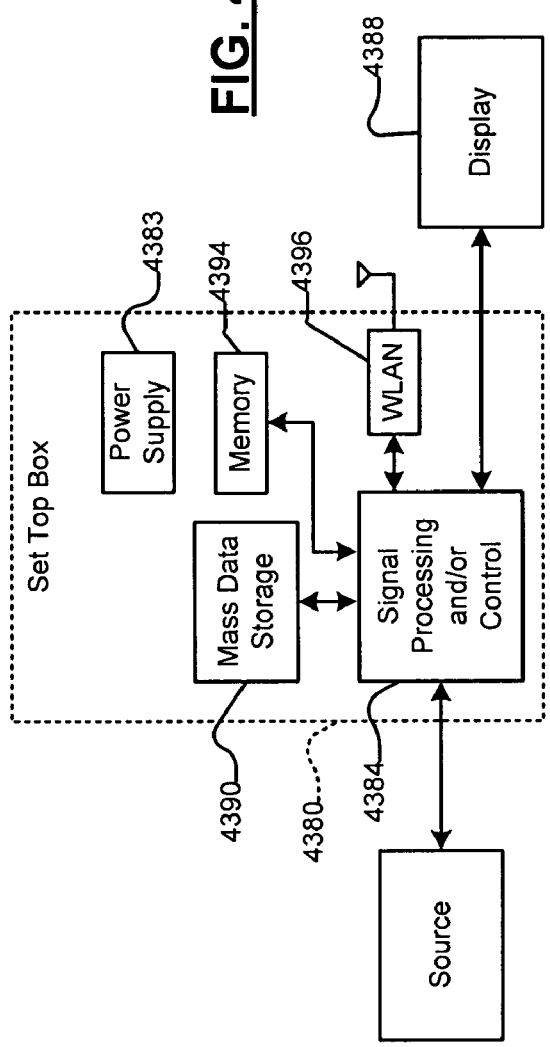
FIG. 43F is a functional block diagram of a set top box.

Referring now to FIG. 43F, the present disclosure can be implemented in amplifiers and/or integrators of a set top box 4380. The present disclosure may implement and/or be implemented in either or both signal processing and/or control circuits, which are generally identified in FIG. 43F at 4384, a WLAN interface, mass data storage of the set top box 4380 and/or a power supply 4383. The set top box 4380 receives signals from a source such as a broadband source and outputs standard and/or high definition audio/video signals suitable for a display 4388 such as a television and/or monitor and/or other video and/or audio output devices. The signal processing and/or control circuits 4384 and/or other circuits (not shown) of the set top box 4380 may process data, perform coding and/or encryption, perform calculations, format data and/or perform any other set top box function.

The set top box 4380 may communicate with mass data storage 4390 that stores data in a nonvolatile manner. The mass data storage 4390 may include optical and/or magnetic storage devices for example hard disk drives HDD and/or DVDs. At least one HDD may have the configuration shown in FIG. 43A and/or at least one DVD may have the configuration shown in FIG. 43B. The HDD may be a mini HDD that includes one or more platters having a diameter that is smaller than approximately 1.8". The set top box 4380 may be connected to memory 4394 such as RAM, ROM, low latency nonvolatile memory such as flash memory and/or other suitable electronic data storage. The set top box 4380 also may support connections with a WLAN via a WLAN network interface 4396.

Figure 43G:
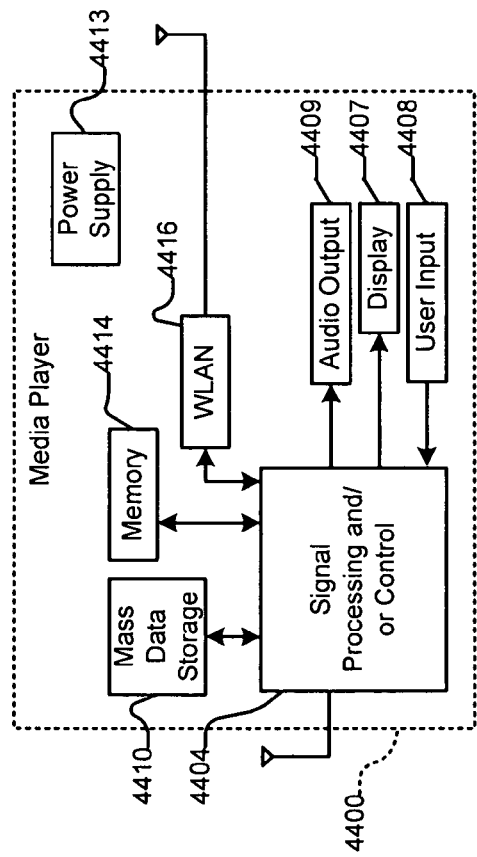
FIG. 43G is a functional block diagram of a media player.

Referring now to FIG. 43G, the present disclosure can be implemented in amplifiers and/or integrators of a media player 4400. The present disclosure may implement and/or be implemented in either or both signal processing and/or control circuits, which are generally identified in FIG. 43G at 4404, a WLAN interface, mass data storage of the media player 4400 and/or a power supply 4403. In some implementations, the media player 4400 includes a display 4407 and/or a user input 4408 such as a keypad, touchpad and the like. In some implementations, the media player 4400 may employ a graphical user interface (GUI) that typically employs menus, drop down menus, icons and/or a point-and-click interface via the display 4407 and/or user input 4408. The media player 4400 further includes an audio output 4409 such as a speaker and/or audio output jack. The signal processing and/or control circuits 4404 and/or other circuits (not shown) of the media player 4400 may process data, perform coding and/or encryption, perform calculations, format data and/or perform any other media player function.

The media player 4400 may communicate with mass data storage 4410 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 43A and/or at least one DVD may have the configuration shown in FIG. 43B. The HDD may be a mini HDD that includes one or more platters having a diameter that is smaller than approximately 1.8". The media player 4400 may be connected to memory 4414 such as RAM, ROM, low latency nonvolatile memory such as flash memory and/or other suitable electronic data storage. The media player 4400 also may support connections with a WLAN via a WLAN network interface 4416. Still other implementations in addition to those described above are contemplated.

Figure 44:
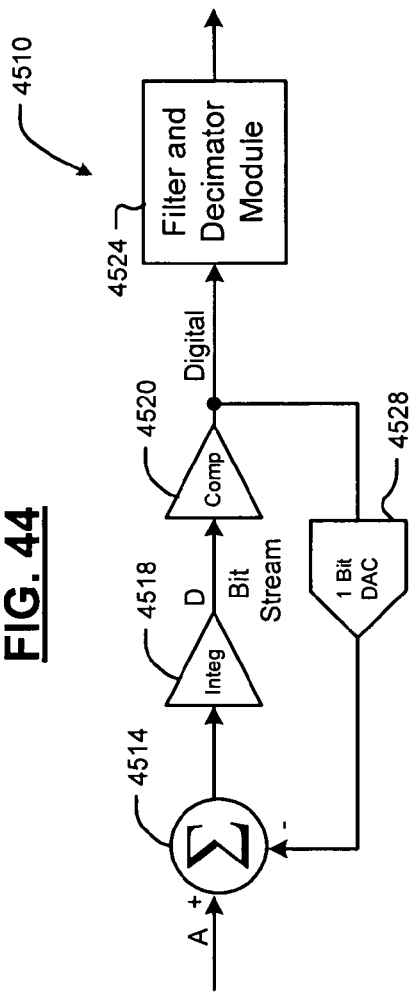
FIG. 44 is a functional block diagram of a Delta-Sigma analog to digital converter (ADC).

Referring now to FIG. 44, a Sigma Delta analog to digital converter (ADC) module 4510 is shown. The Sigma Delta ADC module 2810 includes a difference amplifier module 4514 that receives an analog input signal. An output of the difference amplifier module 4514 is input to an integrator module 4518. An output of the integrator module 4518 is one input of a comparator module 4520. Another input of the comparator module 4520 may be connected to a reference potential such as ground. An output of the comparator module 4520 is input to a filter and decimator module 4524, which outputs a digital signal. The output of the comparator module 4520 is input to a digital to analog converter (DAC) module 4528. The DAC module 4528 may be a 1-bit DAC. An output of the DAC module 4528 is input to an inverting input of the difference amplifier module 4514.

In use, the output of the DAC module 4528 is subtracted from the input signal. The resulting signal is integrated by the integrator module 4518. The integrator output voltage is converted to a single bit digital output (1 or 0) by the comparator module 4520. The resulting bit becomes an input to the DAC module 4528. This closed-loop process may be carried out at a very high oversampled rate. The digital data output by the comparator module is a stream of ones and zeros and the value of the signal is proportional to the density of ones output by the comparator module. For an increasing value, the density of ones increases. For a decreasing value, the density of ones decreases. By summing the error voltage, the integrator acts as a lowpass filter to the input signal and a highpass filter to the quantization noise. The bit stream is digitally filtered by the filter and decimator module to provide a binary-format output.

As can be appreciated, the TIA amplifiers described in the embodiments set forth above may be used to implement one or more of the difference amplifier module, the integrator module and the comparator module in the Sigma Delta DAC module.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A transimpedance amplifier comprising:
   a first operational amplifier having an input and an output;
   a second operational amplifier having an input and an output that directly communicates with said input of said first operational amplifier;

a first feedback element having one end that communicates with said input of said first operational amplifier and another end that communicates with said output of said first operational amplifier, wherein said first feedback element comprises a first capacitance; and a second feedback element that communicates with said input of said first operational amplifier and another end that communicates with said output of said first operational amplifier.

2. The transimpedance amplifier of claim 1 wherein the second feedback element comprises a first resistance.

3. The transimpedance amplifier of claim 1 wherein the first capacitance includes a variable capacitance.

4. The transimpedance amplifier of claim 1 wherein the first feedback element comprises a first resistance in parallel with said first capacitance.

5. A transimpedance amplifier comprising:
a first operational amplifier having an input and an output;
a second operational amplifier having an input and an output that communicates with said input of said first operational amplifier;
a first feedback element having one end that communicates with said input of said first operational amplifier and another end that communicates with said output of said first operational amplifier, wherein said first feedback element comprises a first capacitance; and
a second feedback element that communicates with said input of said first operational amplifier and another end that communicates with said output of said first operational amplifier,
wherein the second feedback element comprises a first resistance in series with a first inductance.

6. The transimpedance amplifier of claim 5 wherein the first capacitance comprises a variable capacitance.

7. The transimpedance amplifier of claim 5 further comprising a first resistance having one end that communicates with said another ends of said first and second feedback elements and another end that communicates with said output of said second operational amplifier.

8. A transimpedance amplifier comprising:
a first operational amplifier having an input and an output;
a second operational amplifier having an input and an output that communicates with said input of said first operational amplifier;
a first feedback element having one end that communicates with said input of said first operational amplifier and another end that communicates with said output of said first operational amplifier, wherein said first feedback element comprises a first capacitance; and
a second feedback element that communicates with said input of said first operational amplifier and another end that communicates with said output of said first operational amplifier,
wherein said first feedback element further comprises a first resistance in series with said first capacitance, and wherein said second feedback element comprises a first inductance in parallel with a second resistance.

9. A differential transimpedance amplifier comprising the transimpedance amplifier of claim 1.

10. A Sigma-Delta analog to digital converter comprising the transimpedance amplifier of claim 1.

11. The Sigma-Delta analog to digital converter of claim 10 further comprising:
a difference amplifier module that includes one input that receives an input signal;
an integrator module that communicates with an output of the difference amplifier module;
a comparator module that receives an output of the integrator module; and
a digital to analog converter module that communicates with an output of the comparator module and another input of the difference amplifier module.

12. The Sigma-Delta analog to digital converter of claim 11 further comprising a filter and decimation module that receives an output of the comparator module.

13. The Sigma-Delta analog to digital converter of claim 11 wherein at least one of said difference amplifier module, said integrator module and said comparator module includes the transimpedance amplifier.

14. A transimpedance amplifier comprising:
first amplifying means for amplifying having an input and an output;
second amplifying means for amplifying having an input and an output that directly communicates with said input of said first amplifying means;
first feedback means for providing feedback having one end that communicates with said input of said first amplifying means and another end that communicates with said output of said first amplifying means, wherein said first feedback means comprises first capacitance means for providing capacitance; and
second feedback means for providing feedback having one end that communicates with said input of said first amplifying means and another end that communicates with said output of said first amplifying means.

15. The transimpedance amplifier of claim 14 wherein the second feedback means comprises first resistance means for providing resistance.

16. The transimpedance amplifier of claim 14 wherein the first capacitance means includes variable capacitance means for providing a variable capacitance.

17. The transimpedance amplifier of claim 14 wherein the first feedback means comprises first resistance means for providing resistance in parallel with said first capacitance means.

18. A transimpedance amplifier comprising:
first amplifying means for amplifying having an input and an output;
second amplifying means for amplifying having an input and an output that communicates with said input of said first amplifying means;
first feedback means for providing feedback having one end that communicates with said input of said first amplifying means and another end that communicates with said output of said first amplifying means, wherein said first feedback means comprises first capacitance means for providing capacitance; and
second feedback means for providing feedback having one end that communicates with said input of said first amplifying means and another end that communicates with said output of said first amplifying means,
wherein the second feedback means comprises first resistance means for providing resistance in series with first inductance means for providing inductance.

19. The transimpedance amplifier of claim 18 wherein the first capacitance means comprises variable capacitance means for providing a variable capacitance.

20. The transimpedance amplifier of claim 14 further comprising first resistance means for providing resistance having one end that communicates with said another ends of said first and second feedback means and another end that communicates with said output of said second amplifying means.

21. A transimpedance amplifier comprising:
first amplifying means for amplifying having an input and an output;
second amplifying means for amplifying having an input and an output that communicates with said input of said first amplifying means;
first feedback means for providing feedback having one end that communicates with said input of said first amplifying means and another end that communicates with said output of said first amplifying means, wherein said first feedback means comprises first capacitance means for providing capacitance; and
second feedback means for providing feedback having one end that communicates with said input of said first amplifying means and another end that communicates with said output of said first amplifying means,
wherein said first feedback means further comprises first resistance means for providing resistance in series with said first capacitance means, and wherein said second feedback means comprises first inductance means for providing inductance in parallel with second resistance means for providing resistance.

22. A differential transimpedance amplifier comprising the transimpedance amplifier of claim 14.

23. A Sigma-Delta analog to digital converter comprising the transimpedance amplifier of claim 14.

24. The Sigma-Delta analog to digital converter of claim 23 further comprising:
difference amplifier means for amplifying that includes one input that receives an input signal;
integrator means for integrating that communicates with an output of the difference amplifier means;
comparator means for comparing that receives an output of the integrator means; and
digital to analog converter means for converting that communicates with an output of the comparator means and another input of the difference amplifier means.

25. The Sigma-Delta analog to digital converter of claim 24 further comprising filter and decimation means for filtering and decimating that receives an output of the comparator means.

26. The Sigma-Delta analog to digital converter of claim 24 wherein at least one of said difference amplifier means, said integrator means and said comparator means includes the transimpedance amplifier.

27. The transimpedance amplifier of claim 1 wherein said output of said second operational amplifier is directly connected to said input of said first operational amplifier.

28. The transimpedance amplifier of claim 1 wherein impedance between said first and second operational amplifiers is negligible.

29. A circuit comprising:
a transimpedance amplifier comprising:
a first operational amplifier having an input and an output;
a second operational amplifier having an input and an output that communicates with said input of said first operational amplifier;
a first feedback element having one end that communicates with said input of said first operational amplifier and another end that communicates with said output of said first operational amplifier, wherein said first feedback element comprises a first capacitance; and
a second feedback element that communicates with said input of said first operational amplifier and another end that communicates with said output of said first operational amplifier,
wherein said first operational amplifier, said first feedback element, and said second feedback element perform as a transimpedance stage.

30. A transimpedance amplifier comprising:
a first operational amplifier having an input and an output;
a second operational amplifier having an input and an output that communicates with said input of said first operational amplifier;
a first feedback element having one end that communicates with said input of said first operational amplifier and another end that communicates with said output of said first operational amplifier, wherein said first feedback element comprises a first capacitance; and
a second feedback element that communicates with said input of said first operational amplifier and another end that communicates with said output of said first operational amplifier,
wherein input of said second operational amplifier is an input of the transimpedance amplifier, and
wherein said output of said second operational amplifier is a current signal that is provided to said first operational amplifier.

* * * * *